(12) United States Patent
Berkowitz et al.

(10) Patent No.: US 9,142,994 B2
(45) Date of Patent: Sep. 22, 2015

(54) METHOD AND CIRCUITRY TO ADAPTIVELY CHARGE A BATTERY/CELL

(71) Applicant: Qnovo Inc., Newark, CA (US)

(72) Inventors: Fred Berkowitz, Los Gatos, CA (US); Dania Ghantous, Walnut Creek, CA (US); Nadim Maluf, Los Altos, CA (US); Christina Peabody, Fremont, CA (US)

(73) Assignee: Qnovo, Inc., Newark, CA (US)

( * ) Notice: Subject to any disclaimer, the term of this patent is extended or adjusted under 35 U.S.C. 154(b) by 375 days.

(21) Appl. No.: 13/626,605

(22) Filed: Sep. 25, 2012

(65) Prior Publication Data

US 2014/0084846 A1   Mar. 27, 2014

(51) Int. Cl.
*H02J 7/00*   (2006.01)

(52) U.S. Cl.
CPC .............. *H02J 7/0093* (2013.01); *H02J 7/0073* (2013.01)

(58) Field of Classification Search
CPC .......... H02J 7/00; H02J 7/0042; H02J 7/0073
USPC .......................................... 320/107, 118, 128
See application file for complete search history.

(56) References Cited

U.S. PATENT DOCUMENTS

| 4,829,225 | A | 5/1989 | Podrazhansky et al. |
| 5,410,238 | A | 4/1995 | Ishizuka et al. |
| 5,684,386 | A | 11/1997 | Okada |
| 5,808,447 | A | 9/1998 | Hagino |
| 5,888,665 | A | 3/1999 | Bugga et al. |
| 5,905,364 | A | 5/1999 | Ookita |
| 5,982,152 | A | 11/1999 | Watanabe et al. |
| 6,040,685 | A | 3/2000 | Tsenter et al. |
| 6,043,631 | A | 3/2000 | Tsenter |
| 6,074,771 | A | 6/2000 | Cobukcu et al. |
| 6,094,033 | A | 7/2000 | Ding et al. |
| 6,097,172 | A | 8/2000 | Podrazhansky et al. |
| 6,127,804 | A | 10/2000 | Oglesbee et al. |
| 6,127,809 | A | 10/2000 | Kates et al. |
| 6,137,265 | A | 10/2000 | Cummings et al. |

(Continued)

FOREIGN PATENT DOCUMENTS

| EP | 01 912 163 | 3/2001 |
| WO | WO 00/13288 | 3/2000 |

(Continued)

OTHER PUBLICATIONS

U.S. Appl. No. 61/044,160, Apr. 2008, Greening et al.

(Continued)

*Primary Examiner* — Mohammed Alam
(74) *Attorney, Agent, or Firm* — Weaver Austin Villeneuve & Sampson LLP

(57) ABSTRACT

The present inventions, in one aspect, are directed to techniques and/or circuitry to applying a charge pulse to the terminals of the battery during a charging operation, measure a plurality of voltages of the battery which are in response to the first charge pulse, determine a charge pulse voltage (CPV) of the battery, wherein the charge pulse voltage is a peak voltage which is in response to the first charge pulse, determine whether the CPV of the battery is within a predetermined range or greater than a predetermined upper limit value and adapt one or more characteristics of a charge packet if the CPV is outside the predetermined range or is greater than a predetermined upper limit value.

25 Claims, 18 Drawing Sheets

(56) References Cited

U.S. PATENT DOCUMENTS

| | | | |
|---|---|---|---|
| 6,144,187 A | 11/2000 | Bryson | |
| 6,194,867 B1 | 2/2001 | Cummings et al. | |
| 6,204,634 B1 | 3/2001 | Zimmerman et al. | |
| 6,215,281 B1 | 4/2001 | Koch | |
| 6,262,577 B1 | 7/2001 | Nakao et al. | |
| 6,307,353 B1 | 10/2001 | Shiojima | |
| 6,313,605 B1 | 11/2001 | Tsenter | |
| 6,362,598 B2 | 3/2002 | Laig-Horstebrock et al. | |
| 6,366,056 B1 | 4/2002 | Podrazhansky et al. | |
| 6,377,028 B1 | 4/2002 | Armstrong, II et al. | |
| 6,441,586 B1 | 8/2002 | Tate, Jr. et al. | |
| 6,469,471 B1 | 10/2002 | Anbuky et al. | |
| 6,532,425 B1 | 3/2003 | Boost et al. | |
| 6,630,814 B2 | 10/2003 | Ptasinski et al. | |
| 6,631,293 B2 | 10/2003 | Lyden | |
| 6,646,419 B1 | 11/2003 | Ying | |
| 6,707,272 B1 | 3/2004 | Thandiwe | |
| 6,789,026 B2 | 9/2004 | Barsoukov et al. | |
| 6,832,171 B2 | 12/2004 | Barsoukov et al. | |
| 6,833,686 B2 | 12/2004 | Veselic et al. | |
| 6,841,974 B2 | 1/2005 | Dykeman | |
| 6,892,148 B2 | 5/2005 | Barsoukov et al. | |
| 6,924,622 B1 | 8/2005 | Anbuky et al. | |
| 7,005,830 B2 | 2/2006 | Moore et al. | |
| 7,034,503 B2 | 4/2006 | Veselic et al. | |
| 7,072,871 B1 | 7/2006 | Tinnemeyer | |
| 7,180,298 B2 | 2/2007 | Nakamura et al. | |
| 7,199,557 B2 | 4/2007 | Anbuky et al. | |
| 7,227,336 B1 | 6/2007 | Van Schalkwijk et al. | |
| 7,245,107 B2 | 7/2007 | Moore et al. | |
| 7,248,023 B2 | 7/2007 | Takezawa et al. | |
| 7,324,902 B2 | 1/2008 | Verbrugge et al. | |
| 7,362,074 B2 | 4/2008 | Iwane et al. | |
| 7,402,980 B2 | 7/2008 | Al-Anbuky et al. | |
| 7,492,130 B2 | 2/2009 | Daboussi | |
| 7,557,541 B2 | 7/2009 | Marinka-Tóth et al. | |
| 7,570,015 B2 | 8/2009 | Bansal et al. | |
| 7,595,611 B2 | 9/2009 | Reynier et al. | |
| 7,626,394 B2 | 12/2009 | Kimura et al. | |
| 7,772,804 B2 | 8/2010 | Bhardwaj et al. | |
| 7,788,052 B2 | 8/2010 | Iwane et al. | |
| 8,040,106 B2 | 10/2011 | Ishikawa | |
| 2002/0070706 A1 | 6/2002 | Champlin | |
| 2002/0075003 A1 | 6/2002 | Fridman et al. | |
| 2002/0109504 A1 | 8/2002 | Champlin | |
| 2002/0117997 A1 | 8/2002 | Feil et al. | |
| 2003/0003363 A1 | 1/2003 | Daido et al. | |
| 2003/0206021 A1 | 11/2003 | Laletin et al. | |
| 2004/0032237 A1* | 2/2004 | Dykeman | 320/141 |
| 2005/0156577 A1 | 7/2005 | Sully | |
| 2005/0189948 A1 | 9/2005 | Koch | |
| 2005/0194938 A1 | 9/2005 | Sanpei | |
| 2005/0214646 A1 | 9/2005 | Kubota | |
| 2005/0248314 A1 | 11/2005 | James | |
| 2005/0264263 A1 | 12/2005 | Tsenter | |
| 2006/0001406 A1* | 1/2006 | Matan | 320/166 |
| 2006/0093894 A1 | 5/2006 | Scott et al. | |
| 2006/0145658 A1 | 7/2006 | Wang | |
| 2006/0186890 A1 | 8/2006 | Iwane et al. | |
| 2006/0208701 A1 | 9/2006 | Mikhaylik | |
| 2006/0238168 A1 | 10/2006 | Matsuo et al. | |
| 2007/0132456 A1 | 6/2007 | Salman et al. | |
| 2007/0216359 A1 | 9/2007 | Arai et al. | |
| 2007/0236225 A1 | 10/2007 | Tsenter et al. | |
| 2007/0257681 A1 | 11/2007 | Christophersen et al. | |
| 2008/0003490 A1 | 1/2008 | Christensen et al. | |
| 2008/0211459 A1 | 9/2008 | Choi | |
| 2009/0027006 A1 | 1/2009 | Vezzini et al. | |
| 2009/0027007 A1 | 1/2009 | Iwane et al. | |
| 2009/0027056 A1 | 1/2009 | Huang et al. | |
| 2009/0195214 A1 | 8/2009 | Gehrke et al. | |
| 2009/0212626 A1 | 8/2009 | Snyder et al. | |
| 2009/0256528 A1 | 10/2009 | Greening et al. | |
| 2009/0259420 A1 | 10/2009 | Greening et al. | |
| 2009/0273320 A1 | 11/2009 | Ungar et al. | |
| 2009/0325056 A1 | 12/2009 | Greening et al. | |
| 2009/0326842 A1 | 12/2009 | Thomas-Alyea | |
| 2010/0000809 A1 | 1/2010 | Nishi et al. | |
| 2010/0039116 A1 | 2/2010 | Tsenter et al. | |
| 2010/0060240 A1* | 3/2010 | Karoui et al. | 320/145 |
| 2010/0066310 A1 | 3/2010 | Biggs, Jr. | |
| 2010/0072955 A1 | 3/2010 | Ishikawa | |
| 2010/0134305 A1 | 6/2010 | Lu et al. | |
| 2010/0164437 A1 | 7/2010 | Mckinley et al. | |
| 2011/0037439 A1 | 2/2011 | Bhardwaj et al. | |
| 2011/0089907 A1 | 4/2011 | Bhardwaj et al. | |
| 2011/0285356 A1* | 11/2011 | Maluf et al. | 320/139 |
| 2011/0316548 A1 | 12/2011 | Ghantous et al. | |
| 2012/0038325 A1 | 2/2012 | Morita et al. | |
| 2012/0200266 A1* | 8/2012 | Berkowitz et al. | 320/139 |

FOREIGN PATENT DOCUMENTS

| | | |
|---|---|---|
| WO | WO 00/75678 | 12/2000 |
| WO | WO 02/21149 | 3/2002 |
| WO | WO 02/21662 | 3/2002 |
| WO | WO 02/41466 | 5/2002 |
| WO | WO 02/093712 | 11/2002 |
| WO | WO 03/107505 | 12/2003 |
| WO | WO 2004/017485 | 2/2004 |
| WO | WO 2004/109311 | 12/2004 |
| WO | WO 2005/003800 | 1/2005 |
| WO | WO 2005/101042 | 10/2005 |
| WO | WO 2005/114808 | 12/2005 |
| WO | WO 2006/057468 | 6/2006 |
| WO | WO 2007/004098 | 1/2007 |
| WO | WO 2008/117239 | 10/2008 |
| WO | WO 2008/128429 | 10/2008 |
| WO | WO 2009/025944 | 2/2009 |
| WO | WO 2009/126734 | 10/2009 |
| WO | WO 2009/126797 | 10/2009 |
| WO | WO 2010/096180 | 8/2010 |
| WO | WO 2012/135148 | 10/2012 |

OTHER PUBLICATIONS

U.S. Appl. No. 61/089,246, Aug. 2008, Greening et al.

"Rapid Charging of Lithium-Ion Batteries using Pulsed Currents", Landau et al., J. of Electrochemical Soc., 153 (3) A533-A542 (2006).

"Reduced Mass Transport Limitations by Application of Special Pulse Current modes", Landau et al., J. of Electrochemical Soc., 152 (4) J33-J39 (2005).

"Intercalation of Lithium Ions into Graphite Electrodes Studied by AC Impedance Measurements", Piao et al., J. of Electrochemical Soc., 146 (8) 2794-98 (1999).

"Lithium Diffusion in Graphitic Carbon", Persson et al, J. Phys. Chem. Letters, 1, 1176-80 (2010).

"A Generalized Cycle Life Model of Rechargeable Lithium-Ion Batteries", Ning et al Electrochimica Acta 51, 2012-2022 (2006).

"Cycle Life Modeling of Lithium-ion Batteries", Ning et al, J. of Electrochemical Soc., 151 (10) A1584-A1591 (2004).

S. Santhanagopalan et al., "Online estimation of the state of charge of a lithium ion cell," Journal of Power Sources, vol. 161 (2006), pp. 1346-1355, Elsevier, B.V.

* cited by examiner

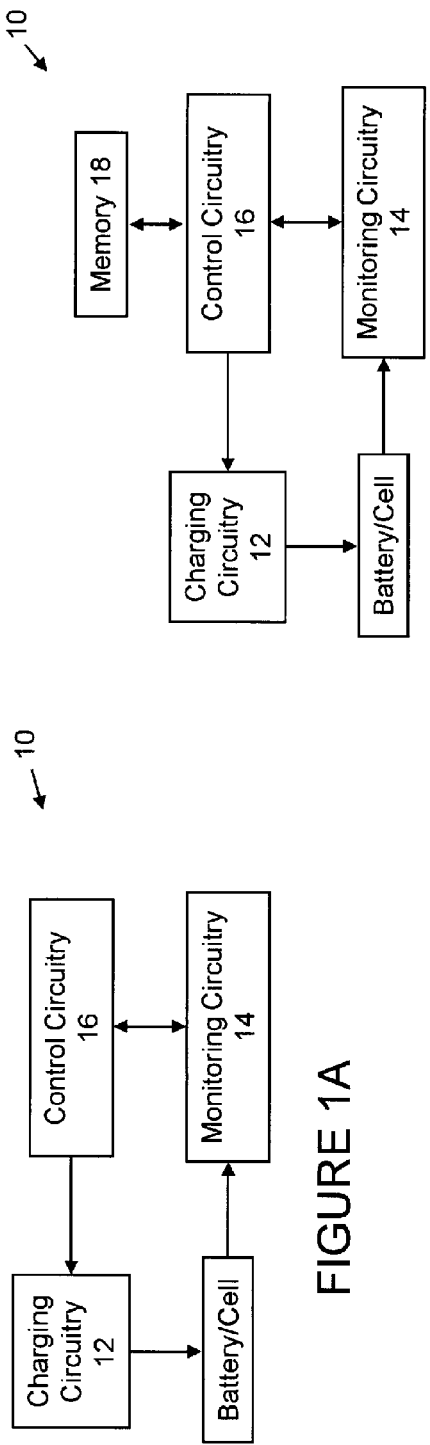
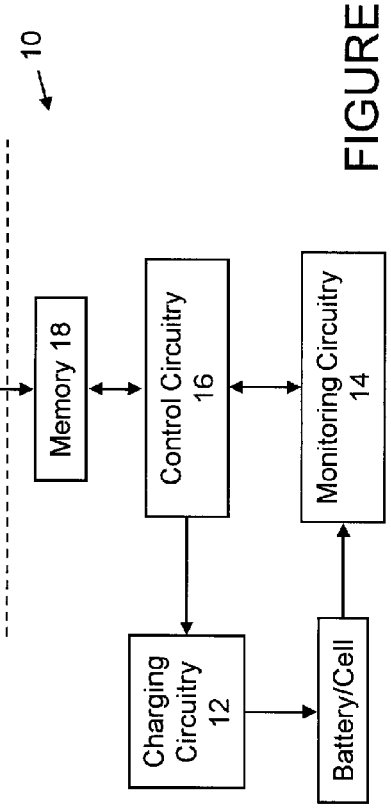

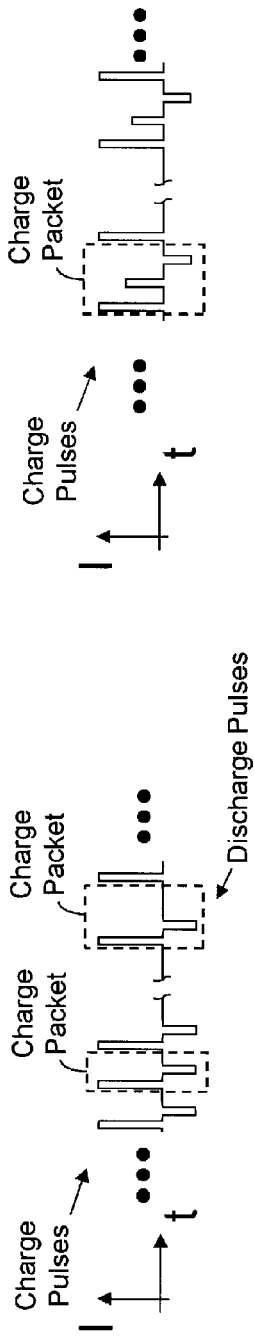
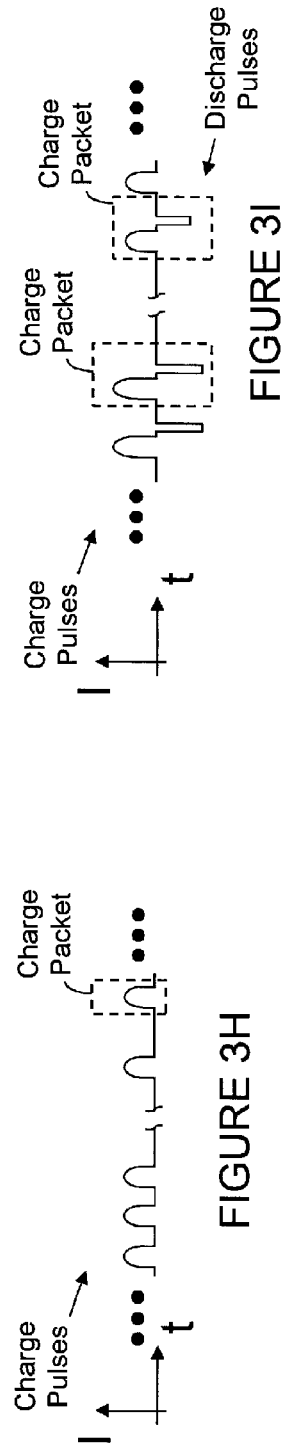
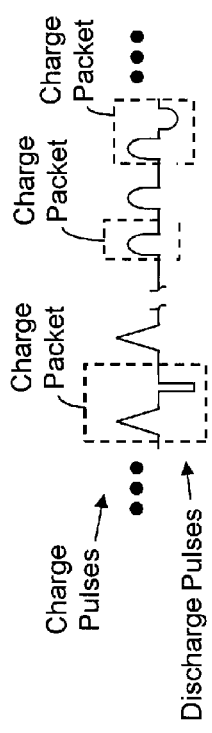

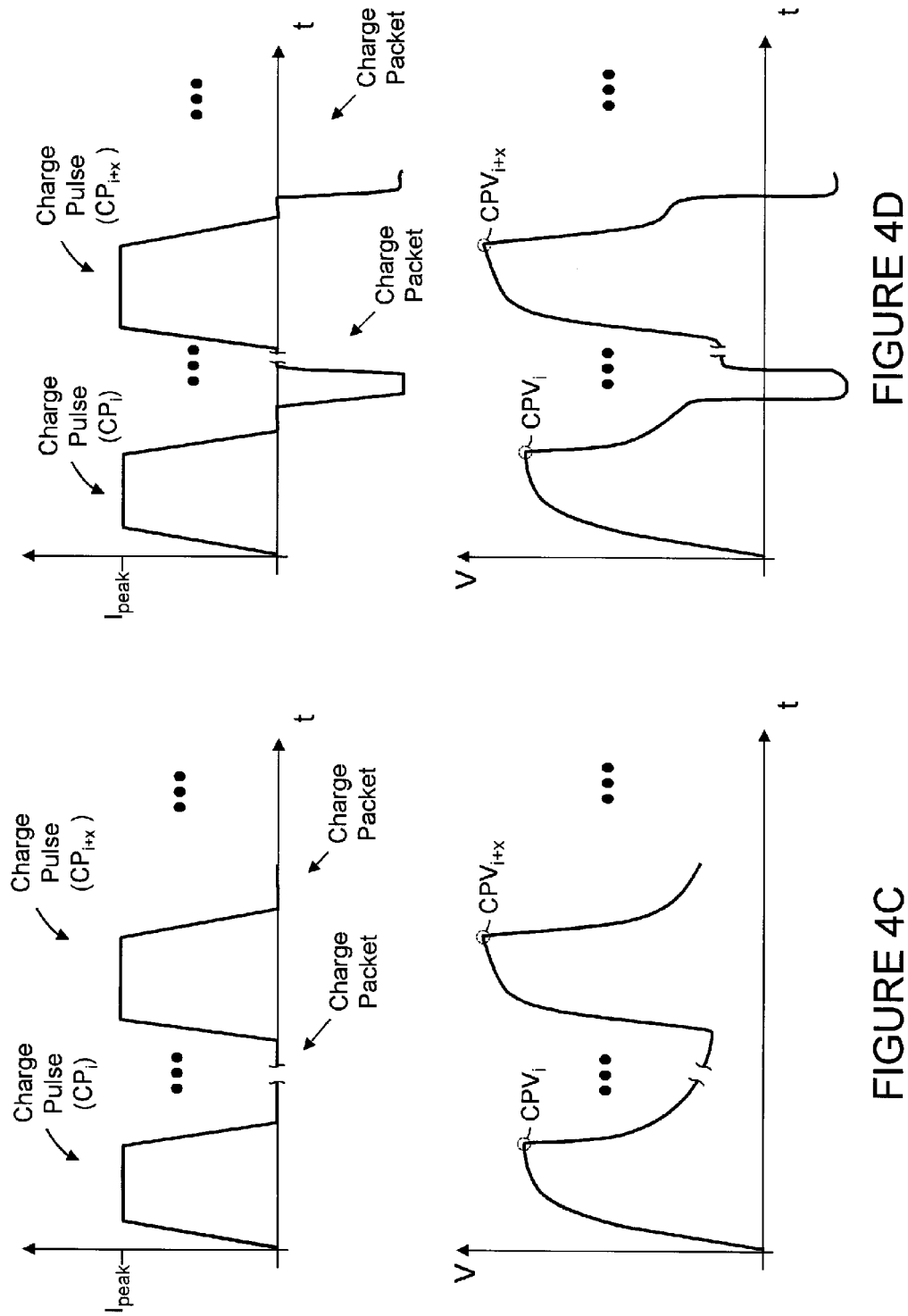

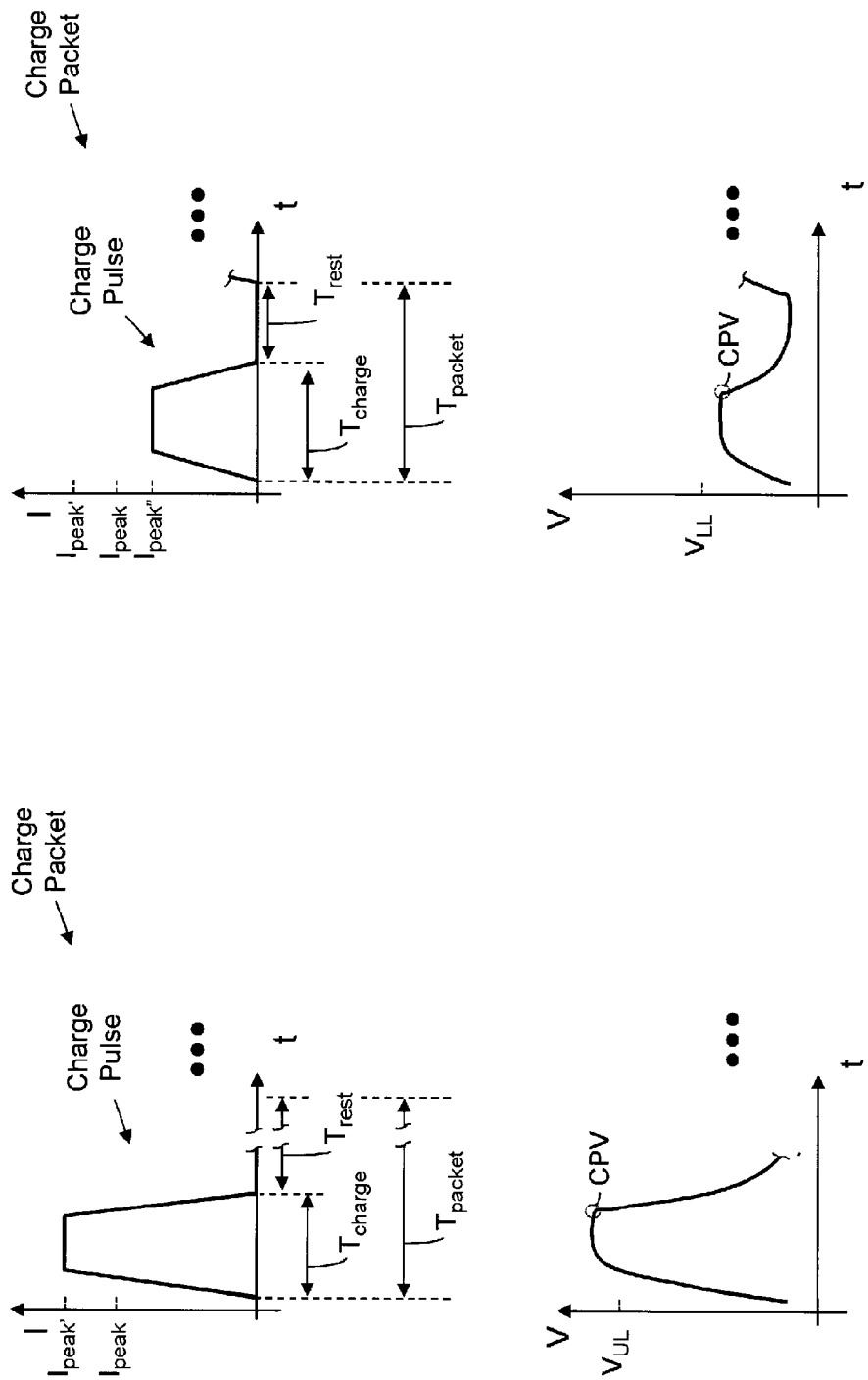

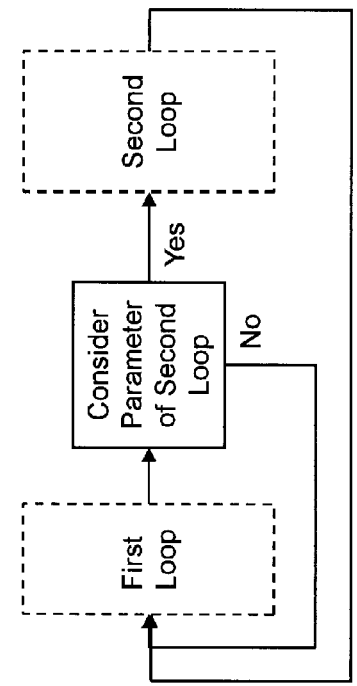
FIGURE 8A
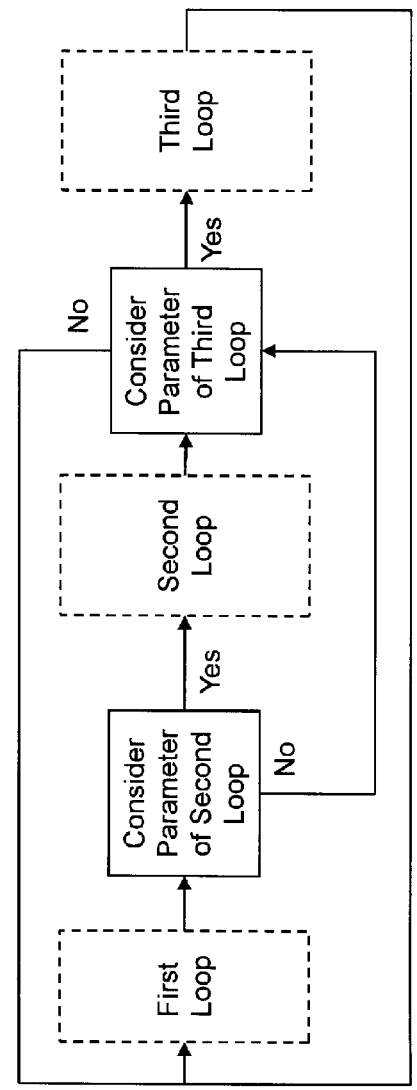
FIGURE 8B
FIGURE 8C

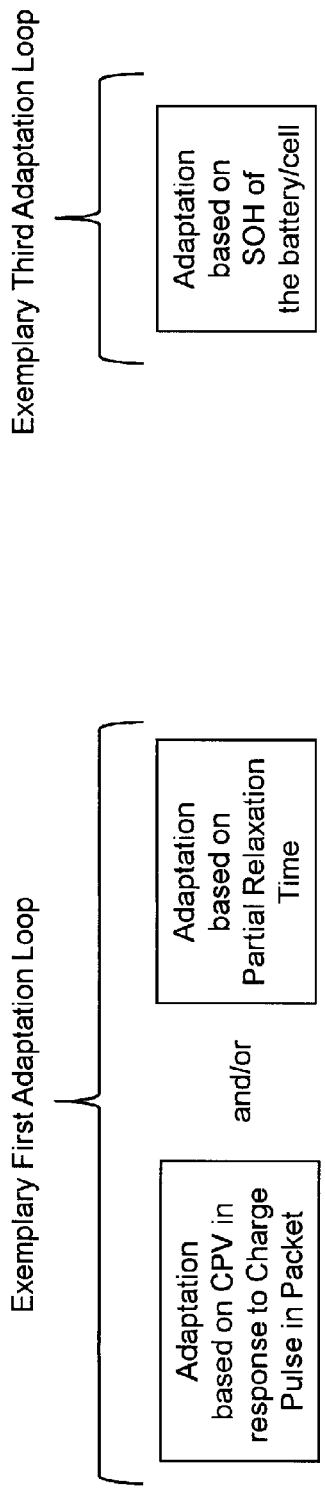
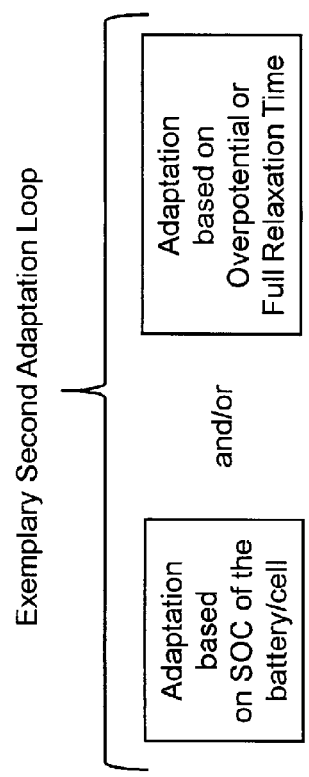
FIGURE 9A
FIGURE 9B
FIGURE 9C
FIGURE 9D

US 9,142,994 B2

METHOD AND CIRCUITRY TO ADAPTIVELY CHARGE A BATTERY/CELL

INTRODUCTION

The present inventions relate to methods and circuitry to adaptively charge a battery/cell. In particular, in one aspect, the present inventions are directed to techniques and/or circuitry to adaptively charge a battery/cell using data which is representative of a charge pulse voltage (CPV) or a change in the CPV. The CPV may be characterized as (i) a peak voltage, measured at the terminals of the battery/cell, which is in response to a charge pulse and/or (ii) a substantial peak voltage (i.e., within 5-10% of the peak voltage), measured at the terminals of the battery/cell, which is in response to a charge pulse.

In one embodiment, the adaptive charging techniques and/or circuitry uses and/or employs such data, in connection with certain constraints or requirements (that will be described below), to change, adjust, control and/or vary the charging current signal(s), including the characteristics thereof (including, for example, shape of charge and/or discharge signal (if any), amplitude thereof, duration thereof, duty cycle thereof and/or rest period (if any)), applied to the terminals of the battery/cell.

Notably, in certain embodiments, two considerations in connection with implementing adaptive charging circuitry and techniques include (i) minimizing and/or reducing total charging time of the battery/cell and (ii) maximizing and/or increasing cycle life of the battery/cell. Here, the adaptive charging circuitry according to certain aspects of the present inventions implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

FIGS. 1A-1C illustrate block diagram representations of exemplary adaptive charging circuitry in conjunction with a battery/cell, according to at least certain aspects of certain embodiments of the present inventions, wherein FIG. 1B includes discrete memory coupled to the control circuitry, and FIG. 1C illustrates circuitry external which accesses the memory to store one or more predetermined ranges employed by control circuitry in conjunction with adapting, adjusting and/or controlling one or more characteristics of the charge or current applied to or injected into the battery/cell so that a change in voltage at the terminals of the battery/cell in response to such charge or current is within a predetermined range and/or below a predetermined value during a charging or recharging sequence, operation or cycle;

FIGS. 4C and 4D illustrate the response of a battery/cell to a plurality of sequential or non-sequential charge pulses of a charge cycle wherein a change in the CPVs of the battery/cell (wherein each CPV is associated with a charge pulse applied to the battery/cell) may be analyzed to determine whether to adjust, adapt, change and/or control one or more characteristics of the charge or current applied to or injected into the battery/cell during a charging or recharging sequence, operation or cycle

FIG. 6A illustrates an exemplary charge packet having a charge pulse which provides an exemplary terminal voltage response of the battery/cell wherein a CPV of the battery/cell (which is responsive to the associated charge pulse) is greater than a predetermined upper limit value ($V_{UL}$), wherein a CPV of the battery/cell (which may correlate to the end of the charge pulse and/or the peak of the change in the terminal voltage due to the charge pulse) is greater than the predetermined upper voltage limit ($V_{UL}$); notably, in one embodiment, the charging circuitry, in response to instructions from the control circuitry, adjusts the amplitude of the charge pulse (and/or the length of the associated rest period) to decrease the responsive terminal voltage so that the CPV of the battery/cell is within a predetermined range and/or less than a predetermined upper limit value during a charging or recharging sequence, operation or cycle;

FIG. 6B illustrates an exemplary charge packet having a charge pulse which provides an exemplary terminal voltage response of the battery/cell wherein a CPV of the battery/cell (which is responsive to the associated charge pulse) is less than a predetermined lower voltage limit ($V_{LL}$), wherein a CPV of the battery/cell (which may correlate to the end of the charge pulse and/or the peak of the change in the terminal voltage due to the charge pulse) is less than a predetermined lower voltage limit ($V_{LL}$); notably, in one embodiment, the charging circuitry, in response to instructions from the control circuitry, adjusts the amplitude of the charge pulse (and/or the length of the associated rest period) to increase the responsive terminal voltage so that the CPV of the battery/cell is within a predetermined range and/or greater than a predetermined lower limit value during a charging or recharging sequence, operation or cycle;

FIGS. 8A-8E illustrate, in flowchart like form, adaptive charging techniques having one or more adaption loops wherein each adaption loop estimates, calculates, measures and/or determines one or more different parameters (for example, CPV and/or change in CPV); notably, the adaptation loops may be implemented alone/separately or in combination; all combinations or permutations thereof are intended to fall within the scope of the present inventions; a more detailed discussion of the second through Nth loop is set forth in application Ser. No. 13/366,352 "Method and Circuitry to Calculate the State of Charge of a Battery/Cell", which is incorporated herein by reference;

FIGS. 9A-9D illustrate exemplary parameters of the adaption loops including, for example, (i) a first adaption loop based on CPV and/or change in CPV in response to one or more charge pulses (of one or more charge/discharge packets), (ii) a second adaption loop based on SOC of the battery/cell and/or full relaxation time or overpotential, (iii) a third adaption loop based on SOH (or changes therein) of the battery/cell, and (iv) a fourth adaption loop based on the temperature of the battery/cell (notably, in this embodiment, the system includes a temperature sensor to provide data which is representative of the temperature of the battery/cell); a more detailed discussion of the second through 4th adaption loop is set forth in application Ser. No. 13/366,352, which as indicated above is incorporated by reference;

Figures 1D, 1E:
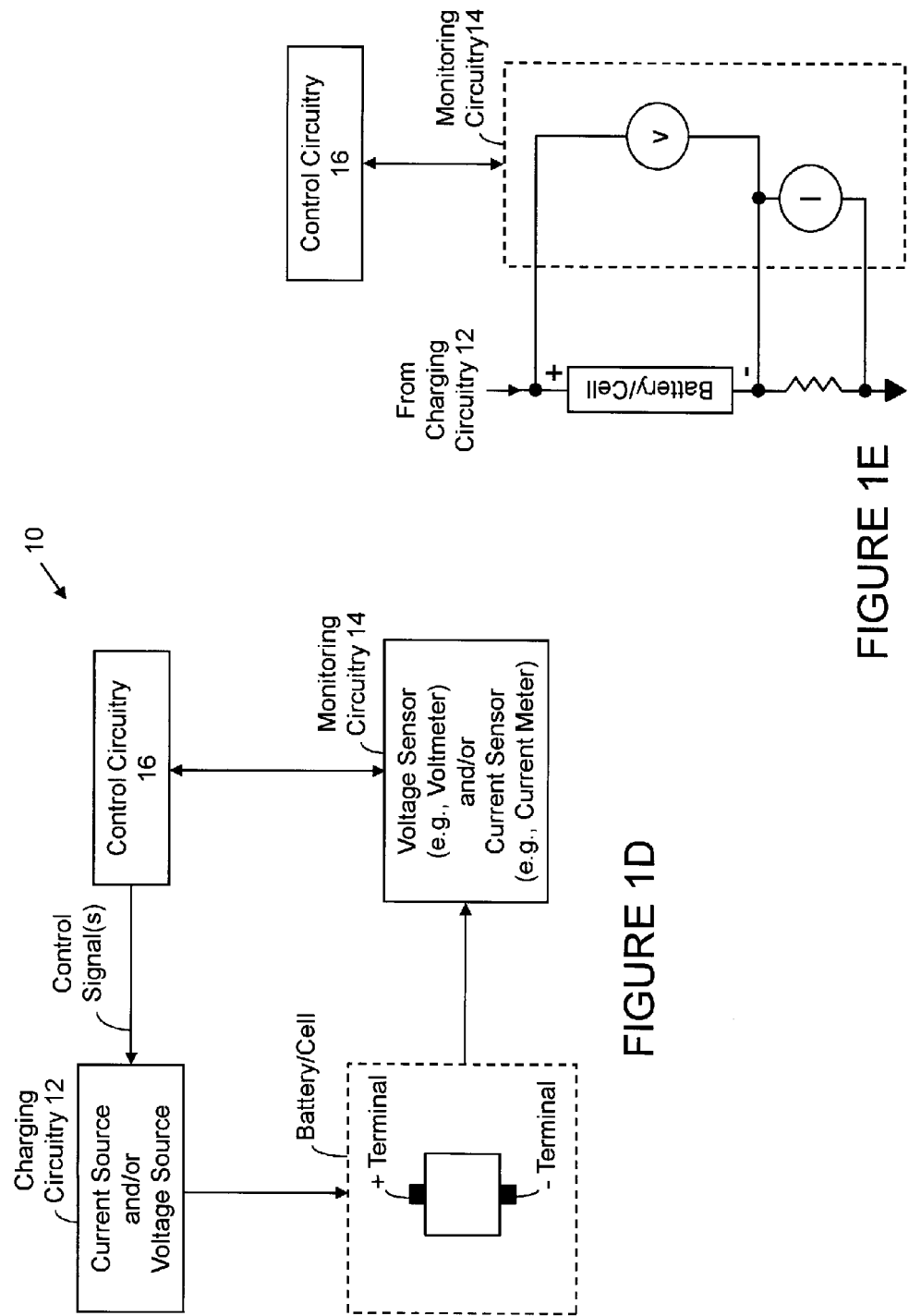
FIGS. 1D and 1E illustrate, in block diagram form, exemplary adaptive charging circuitry in conjunction with a battery/cell (which may include two terminals (for example, positive and negative terminals), according to at least certain aspects of certain embodiments of the present inventions, wherein in this embodiment, the charging circuitry may include voltage source and/or current source, and the monitoring circuitry may include voltage and/or current sensors (for example, a voltmeter and/or a current meter)

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In a first aspect, the present inventions are directed to adaptive charging techniques and/or circuitry for a battery/cell wherein the charging techniques and/or circuitry adapt, adjust and/or control one or more characteristics of the charge or current applied to or injected into the battery/cell so that the CPV of the battery, which is in response to a charge pulse, and/or the change in CPVs associated with two or more charge pulses is (i) less than a predetermined upper limit value, (ii) greater than a predetermined lower limit value and/or (iii) within a predetermined range (for example, less than a predetermined upper limit value and greater than a predetermined lower limit value) during a charging or recharging sequence, operation or cycle. As noted above, a CPV (charge pulse voltage) of the battery/cell may be characterized as (i) a peak voltage, measured at the terminals of the battery/cell, which is in response to a charge pulse and/or (ii) a substantial peak voltage (i.e., within 5-10% of the peak voltage), measured at the terminals of the battery/cell, which is in response to a charge pulse. For example, where the charging techniques and/or circuitry apply charge packets, having one or more charge pulses, to the battery/cell during a charging sequence, cycle or operation, in one embodiment, the charging techniques and/or circuitry may adapt, adjust and/or control the amplitude and/or pulse width of the charge pulses applied to or injected into the battery/cell by subsequent packet(s) (for example, the immediately subsequent packets) so that the CPV of the battery/cell and/or the change in CPVs of the battery/cell, in response to subsequent charge packet(s), is within a predetermined range, less than a predetermined upper limit value and/or less than a predetermined lower limit value. In one embodiment, the charging techniques and/or circuitry adapt, adjust and/or control one or more characteristics of the charge or current applied to or injected into the battery/cell via adapting, adjusting and/or controlling the shape, amplitude and/or width of charge pulse(s) of the subsequent packet(s).

In another embodiment, the charging techniques and/or circuitry apply charge packets, having one or more charge pulses and one or more discharge pulses, to the battery/cell during a charging sequence, cycle or operation. In this embodiment, the charging techniques and/or circuitry may adapt, adjust and/or control one or more characteristics of the charge or current applied to or injected into the battery/cell (via the charge pulses) and/or one or more characteristics of the charge or current removed from the battery/cell (via the discharge pulses) so the CPV of the battery, which is in response to a subsequent charge packet, and/or the change in CPVs associated with two or more subsequent charge packets is (i) less than a predetermined upper limit value, (ii) greater than a predetermined lower limit value and/or (iii) within a predetermined range during charging or recharging sequence, operation or cycle. In this way, the CPV of the battery/cell, in response to subsequent packets, satisfies one or more of the aforementioned criteria during the charging sequence, cycle or operation. For example, the adaptive charging techniques and/or circuitry of the present inventions may adapt, adjust and/or control shape, amplitude and/or width of charge pulse(s) and the shape, amplitude and/or width of discharge pulse(s) in a manner so that (i) a CPV of the battery/cell, (ii) a change in CPV of the battery/cell are within predetermined range during the charging sequence, cycle or operation. In addition thereto, or in lieu thereof, the adaptive charging techniques and/or circuitry of the present inventions may adapt, adjust and/or control shape, amplitude and/or width of charge pulse(s) and discharge pulse(s) in a manner that provides (i) a CPV of the battery/cell due to the charge pulse(s) of subsequent packet(s) and/or (ii) a change in CPV of the battery/cell between a plurality of charge pulse(s) of the packet to be is less than a predetermined upper limit value, greater than a predetermined lower limit value and/or within a predetermined range during charging or recharging sequence, operation or cycle. Thus, in those embodiments where the charge packet includes one or more charge and discharge pulses, the charging techniques and/or circuitry of the present inventions may adapt, adjust and/or control one or more characteristics of the charge and/or discharge to control the CPV of the battery/cell in response to subsequent packets.

Notably, the charging techniques and/or circuitry may adapt, adjust and/or control the characteristics of the charge or current applied to or injected into the battery/cell based on or using an averaged response of the battery/cell in connection with (i) a plurality of pulses in the packet and/or (ii) a plurality of packets. For example, where the packets include a plurality of charge pulses and/or a plurality of discharge pulses, the charging techniques and/or circuitry may employ an average change in CPV in connection with the plurality of charge pulses. In this embodiment, the charging techniques and/or circuitry of the present inventions may adapt, adjust and/or control the characteristics of the charge and discharge pulses applied to or injected into the battery/cell during subsequent packets based on or using an averaged CPV response of the battery/cell to plurality of charge pulses and/or a plurality of discharge pulses. Thus, in one embodiment, the charging techniques and/or circuitry of the present inventions adapt, adjust and/or control the characteristics of one or more of the charge and/or discharge pulses (of subsequent packets) applied to the battery/cell based on or using the CPV and/or change in CPV of the battery/cell averaged over a plurality of preceding packet (for example, the immediately preceding) is less than a predetermined upper limit value, greater than a predetermined lower limit value and/or within a predetermined range during charging or recharging sequence, operation or cycle In another embodiment, the charging techniques and/or circuitry of the present inventions may adapt, adjust and/or control the amount of charge or current applied to or injected into the battery/cell by the packets so that the CPV of the battery/cell and/or change CPV of the battery/cell averaged over a plurality of charge packet meets the criteria described above. Here, the charging techniques and/or circuitry may adapt, adjust and/or control the characteristics of the charge applied to or injected into the battery/cell (via, for example, adapting, adjusting and/or controlling the shape, amplitude and/or width of charge pulse(s)) when an average CPV and/or change in CPV of the battery/cell in response to a plurality of charge packet is outside a predetermined range, less than a predetermined lower limit and/or greater than a predetermined upper limit.

The charging techniques and/or circuitry of the present inventions may employ any form of averaging. For example, the charging techniques and/or circuitry of the present inventions may average mutually exclusive groups of packets. Alternatively, the charging techniques and/or circuitry may employ a "rolling" average technique wherein the techniques and/or circuitry determine or calculate a "new" average CPV as a change in voltage at the terminals of the battery/cell, in response to a charge packet.

The adaptive charging techniques and/or circuitry of the present inventions may intermittently, continuously and/or periodically adapt, adjust and/or control characteristics of the charge or current applied to or injected into the battery/cell in connection with maintaining the change in CPV within a predetermined range. For example, in one embodiment, the adaptive charging techniques and/or circuitry intermittently, continuously and/or periodically measure or monitor the CPV of the battery/cell (for example, measure or monitor the voltage of the battery/cell at the terminals thereof every Nth packet (where N=1 to 10) and/or every 10-1000 ms). Based thereon or using such data, the adaptive charging techniques and/or circuitry may intermittently, continuously and/or periodically determine and/or adapt the characteristics of the charge or current injected into the battery/cell (or adapt the characteristics of the charge removed from the battery/cell in those embodiments where a discharge current is employed) so that the CPV and/or change in CPV is within a predetermined range, less than a predetermined value and/or greater than a predetermined lower limit (for example, determine and/or adapt the characteristics of the charge or current injected into the battery/cell every Nth packet (where N=1 to 10) and/or every 10-1000 ms). In one embodiment, the adaptive charging techniques and/or circuitry may intermittently, continuously and/or periodically determine the CPV of the battery/cell and, in response thereto or based thereon, may intermittently, continuously and/or periodically determine an amplitude and duration of subsequent charge pulses to be applied to or injected into the battery/cell (which, in one embodiment, may be charge pulses of the immediately subsequent packet(s)) so that the CPV and/or change in CPV of the battery/cell due to such subsequent charge pulses satisfies one or more of the aforementioned criteria.

Thus, adaptive charging techniques and/or circuitry of the present inventions may (i) measure or monitor the terminal voltage of the battery/cell on an intermittent, continuous and/or periodic basis, (ii) determine whether a CPV and/or a change in CPV (which is response to charge pulses) is within a predetermined range, below a predetermined value and/or above a predetermined value on an intermittent, continuous and/or periodic basis, and/or (iii) adapt, adjust and/or control characteristics of the charge or current signals applied to or injected into the battery/cell (for example, amplitude of the applied charge or current) so that the CPV and/or change in CPV of subsequent charge pulses and/or packets is within a predetermined range, less than a predetermined upper limit value, and/or greater than a predetermined lower limit value on an intermittent, continuous and/or periodic basis. For example, adaptive charging techniques and/or circuitry of the present inventions may (i) monitor, measure and/or determine the CPV of the battery/cell at the terminals of the battery/cell every X packets (where X=1 to 10), (ii) determine, every Y packets (where Y=1 to 10), whether a CPV and/or change in CPV (which is in response to charge pulses) is within a predetermined range and/or below a predetermined value, and/or (iii) adapt, adjust and/or control characteristics of the charge or current signals applied to or injected into the battery/cell, every Z packets (where Z=1 to 10), so that the CPV and/or change in CPV meets one or more of the aforementioned criteria. All permutations and combinations are intended to fall within the scope of the present inventions. Indeed, such embodiments are applicable to the charging techniques and/or circuitry which apply or inject (i) charge packets having one or more charge pulses and (ii) charge packets having one or more charge pulses and one or more discharge pulses.

Notably, the predetermined range may be fixed or may change, for example, over time, use and/or external operating conditions (for example, external temperature). The predetermined range may change based on one or more conditions or states of the battery/cell (for example, state of charge). In addition thereto, or in lieu thereof, the predetermined range may change based on one or more responses of the battery/cell to or during the charging process.

In one embodiment, the predetermined range is based on empirical data, test data, simulation data, theoretical data and/or a mathematical relationship. For example, based on empirical data, the adaptive charging techniques and/or circuitry associated with a given battery/cell (for example, a certain series, manufacturing lot, chemistry and/or design) may determine, calculate and/or employ a predetermined range as well as changes therein. Again, such changes may (i) be fixed, (ii) based on one or more conditions or states of the battery/cell, and/or (iii) based on one or more responses of the battery/cell to or during the charging process.

In another embodiment, the predetermined range may change based on, for example, a condition or state of the battery/cell and/or response of the battery/cell to the charging processes. For example, the predetermined range may depend on one or more parameters of the battery/cell including, for example, the state of charge (SOC) and/or state of health (SOH) of the battery. Here, the circuitry and/or techniques of the present inventions may adjust, change and/or adapt the predetermined range employed to determine whether a change in a CPV of the battery/cell (which is response to charge pulses) is within a predetermined range and/or below a predetermined value based on or using data which is representative of the SOC of the battery/cell and/or SOH of the battery/cell.

Notably, the SOC of a battery/cell, for example, a lithium-ion rechargeable battery/cell, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a 0% indicates that the battery/cell is fully discharged. The SOC of the battery/cell may also be characterized as an available charge stored in the battery/cell relative to a maximum available charge stored in the battery/cell—wherein the maximum available charge may change over time as, for example, the battery/cell ages or deteriorates. As indicated herein, changes in the operating conditions may impact the battery/cell. For example, changes in temperature of the battery/cell may impact a maximum amount of charge the battery/cell is capable of storing and/or the maximum available charge from the battery/cell (hereinafter collectively, $Q_{max}$). For example, it is known that $Q_{max}$ decreases with lower temperature. Moreover, as discussed in detail below, such operating conditions and changes in temperature may impact one or more of the predetermined values and/or ranges associated with the CPV or changes in the CPV of the battery/cell.

The SOH of a rechargeable battery/cell (for example, a rechargeable lithium-ion battery/cell, is a parameter that describes, characterizes and/or is representative of the "age" of the battery/cell, the degradation levels of the battery/cell and/or an ability of the battery/cell to hold charge, for example, relative to a given time in operation (for example, the initial time in operation). The CPV of the battery/cell which is responsive to a given charge pulse and for a given SOC changes as the SOH changes—and, hence the voltage curves of the battery/cell tend to shift as the battery/cell ages and as the battery/cell SOH deteriorates.

In one embodiment, based on or using initialization, characterization and/or calibration data, the adaptive charging techniques and/or circuitry of the present inventions may calculate or determine an initial predetermined range or set of predetermined ranges for the particular battery/cell. For example, in one embodiment, based on or using (i) initialization, characterization and/or calibration data and (ii) empirical data, test data, simulation data, theoretical data and/or a mathematical relationship, the adaptive charging techniques and/or circuitry of the present inventions may calculate or determine one or more predetermined ranges for a particular or associated battery/cell. Indeed, in one embodiment, the adaptive charging techniques and/or circuitry of the present inventions, based on or using (i) initialization, characterization and/or calibration data and (ii) empirical data, test data, simulation data, theoretical data and/or a mathematical relationship, may calculate or determine a pattern or relationship of the change of the predetermined range over time/use (for example, (i) change based on one or more conditions or states of the battery/cell, (ii) change based on one or more responses of the battery/cell to or during the charging processes).

Determination or calculation of a predetermined range or set of predetermined ranges may also employ data which is representative of a series, manufacturing lot, chemistry and/or design of the battery/cell. In one embodiment, based on empirical data, test data, simulation data, theoretical data and/or a mathematical relationship in conjunction with data which is representative of a series, manufacturing lot, chemistry and/or design of the battery/cell, one or more predetermined ranges time/use may be determined or calculated. In addition, one or more changes to such predetermined ranges (which may be based on one or more conditions or states of the battery/cell and/or responses of the battery/cell to or during the charging processes) may be determined or calculated. In yet another embodiment, a predetermined range or set of predetermined ranges may be determined or calculated for a given battery/cell based on or using (i) the battery/cell response to an initialization, characterization and/or calibration signals or sequence, and (ii) empirical data, which may, for example, be developed based on a certain series, manufacturing lot, chemistry and/or design. Notably, data which is representative of a predetermined range or set of predetermined ranges may be stored in memory, coupled to the battery/cell, for use by the adaptive charging techniques and/or circuitry of the present inventions.

In another embodiment, an initial predetermined upper limit value, predetermined lower limit value and/or predetermined range or set of predetermined ranges for a particular battery/cell may be based on or using initialization, characterization or calibration data of the battery/cell. The initialization, characterization and/or calibration data may be representative of the response of the battery/cell to a characterization sequence. In one embodiment, the characterization sequence may apply charge signals to the battery/cell. Thereafter, the adaptive charging techniques and/or circuitry may evaluate the response to such signals by the battery/cell—including determining and/or measuring the CPV of a battery/cell over the SOC of the battery/cell (which may be the actual battery/cell or a representative thereof). Based thereon, the adaptive charging techniques and/or circuitry may calculate or determine predetermined values and ranges for the particular battery/cell. Such initialization, characterization or calibration data may be obtained, acquired and/or determined, for example, at manufacture, test or calibration which may include the characterization sequence to obtain "unique" data regarding a given battery/cell.

Briefly, the initialization, characterization or calibration sequences may seek to establish values for certain of the predetermined limits and ranges discussed herein. In one embodiment, the initialization, characterization or calibration sequences measure the change in terminal voltage in response to charge and/or discharge packets (having charge and/or discharge pulses) for new cells/batteries over the full range of SOC. In a second embodiment, these values are used to cycle cells/batteries, and correlation data or tables are generated to correlate these change in terminal voltage with the capacity fade of the cells/batteries, and consequently with cycle life. Different values may be used on different cells to create more complete correlation relationships between changes in terminal voltage values or ranges and capacity fade. Additionally, the change in terminal voltage values or ranges may be correlated using physical models to the transport of lithium-ions, such as solving Fick's law and current transport law within the battery/cell.

Notably, the predetermined values and/or ranges may be calculated or determined by the adaptive circuitry and/or processes of the present inventions or by other circuitry and processes (for example, circuitry which is "off-device", "off-chip" or separate from the circuitry of the present inventions). The predetermined values and/or ranges may be stored in memory (for example, in a database or look-up table) during manufacture, test or calibration, and accessible to the adaptive circuitry and/or processes of the present inventions during operation.

As noted herein, the predetermined values and/or ranges may change relative to initial predetermined ranges in a predetermined manner (for example, in a fixed relationship over time/use—which may be based on or using empirical data, test data, simulation data, theoretical data and/or a mathematical relationship). In addition thereto, or in lieu thereof, such predetermined ranges may depend on considerations such as the state or status of one or more parameters of the battery/cell including, for example, the SOC, the SOH and/or temperature of the battery/cell. Notably, where one of such parameters is temperature, the system may include a temperature sensor (thermally coupled to the battery/cell) to provide data which is representative of the temperature of the battery/cell.

For example, in one embodiment, the predetermined ranges depend on the SOC of the battery/cell. In this regard, the adaptive charging circuitry and techniques may apply or inject a higher current or charge into the battery/cell when the SOC of the battery/cell is low and a lower current or charge when the SOC of the battery/cell is high. Here, when an electrical current charges a lithium-ion cell, lithium ions move from the cathode across the electrolyte and diffuse into the grains of the anode. Thus, at a low SOC, the diffusion rate of lithium ions into the anode can be faster than the diffusion rate at a high SOC. The difference in diffusion rate can vary substantially. Additionally, it may be beneficial to use a higher charging current when the impedance (in particular, the real part thereof, which is representative of the resistance that the battery/cell exhibits to an applied electrical current) is low and a lower charging current when the impedance is high. Therefore, in one embodiment, the adaptive charging algorithm or technique tailors, changes and/or adjusts the charging current to control, manage and/or reduce the CPV and/or change in CPV in response to such charging current.

Notably, as the charging techniques and/or circuitry adapts, adjusts and/or controls one or more characteristics of the charge or current applied to or injected into the battery/cell so that the change in CPV of the battery/cell in response to subsequent charging is within a predetermined range and/or below a predetermined value may impact the net effective charge rate. That is, the net effective charge rate may be adjusted and/or controlled by way of adjusting and/or controlling one or more characteristics of the charge or charging signal during a given charging period including, for example, the amplitude of the current charge or charging signal, the shape of the charge or charging signal (for example, triangular, rectangular, sawtooth and/or square waves), the duration or width of the current charge or charging signal, the frequency of the charge or charging signal and/or the duty cycle of the charge or charging signal. However, the charging techniques and/or circuitry may calculate, determine and/or estimate a peak amplitude and/or duration of the current pulse(s) (for a given pulse shape—for example, rectangular, triangle, sinusoidal or square current pulses) and responsively control the charging to minimize and/or reduce the temporal duration of the overall charge sequence, cycle or operation. Indeed, the charging techniques and/or circuitry may apply or inject less than a maximum charge (without the responsive terminal voltage of the battery/cell attaining predetermined range) into the battery/cell during one or more portions of the charging sequence, cycle or operation. Under this circumstance, the temporal duration of the overall charging sequence, cycle or operation may likely increase.

The predetermined values and/or ranges may be stored in permanent, semi-permanent or temporary memory. In this regard, the memory may store data, equations, relationships, database and/or look-up table in a permanent, semi-permanent or temporary (for example, until re-programmed) memory of any kind or type (for example, EEPROM, Flash, DRAM and/or SRAM). Moreover, the memory may be discrete or resident on (i.e., integrated in) other circuitry of the present inventions (for example, control circuitry). In one embodiment, the memory may be one-time programmable, and/or the data, equations, relationships, database and/or look-up table of the predetermined range(s) may be stored in a one-time programmable memory (for example, programmed during test or at manufacture). In another embodiment, the memory is more than one-time programmable and, as such, the predetermined range(s) may be updated, written, re-written and/or modified after initial storage (for example, after test and/or manufacture) via external or internal circuitry.

It should be noted that, in certain embodiments, two considerations in connection with implementing the adaptive charging circuitry and techniques of the present inventions are to:

i. Minimize and/or reduce total charging time: For practical reasons, the battery/cell is charged within a given period of time (for example, a maximum allowed period of time). Typically, a specification value is defined or chosen depending on the application; and ii. Maximize and/or increase cycle life: To maximize and/or increase cycle life of the battery/cell, here there is a tendency to charge the battery/cell (i) at a low current and/or (ii) provide rest periods between or in periods of charging (for example, between charging signals or packets) wherein no charge is applied to or injected into the battery/cell.

Thus, in certain aspects, the charging circuitry of the present inventions using the CPV and/or change in CPV of the battery/cell implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

Figure 2A:
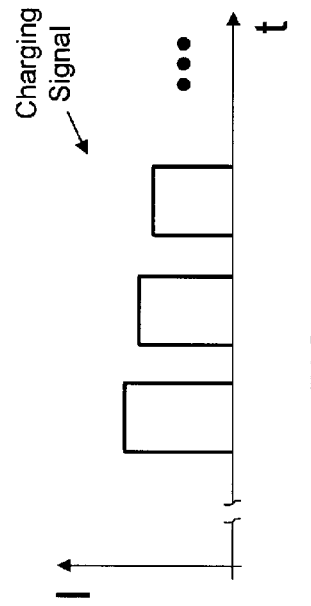
FIGS. 2A-2D illustrate exemplary waveforms illustrating a plurality of exemplary charging signals and discharging signals of an exemplary charging technique, wherein such charging signals may generally decrease according to a predetermined rate and/or pattern (for example, asymptotically, linearly or quadratically) as the terminal voltage of the battery/cell increases during a charging or recharging sequence, operation or cycle (see, FIGS. 2B and 2D); notably, a charging or recharging sequence, operation or cycle may include charging signals (which, in total, inject or apply charge into the battery/cell) and discharging signals (which, in total, remove charge from the battery/cell)
Figure 2B:
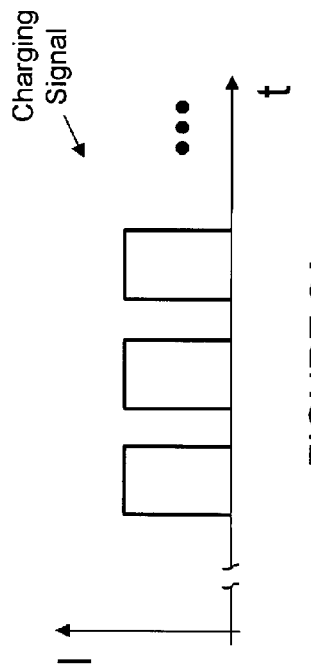
Figure 2C:
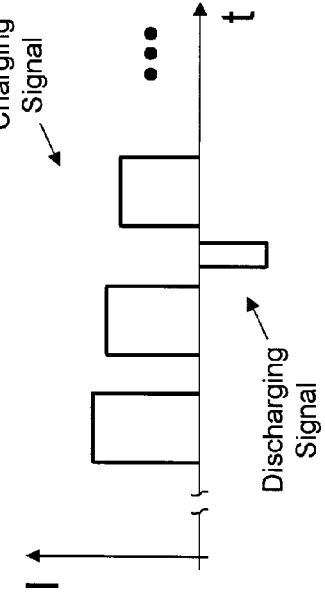
Figure 2D:
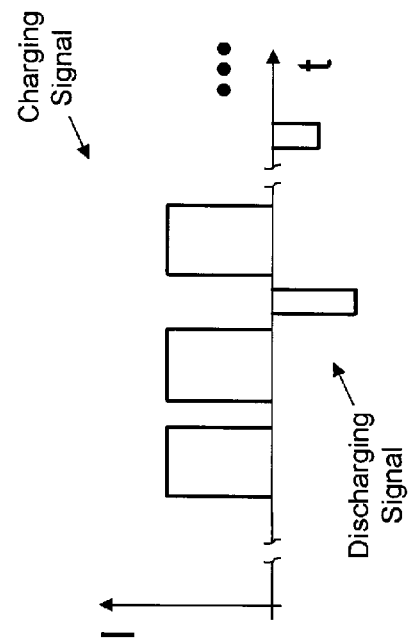

With reference to FIG. 1A, in one exemplary embodiment, adaptive charging circuitry 10 for a battery/cell includes charging circuitry 12, monitoring circuitry 14 and control circuitry 16 which implements one or more of the adaptive charging techniques described herein. Briefly, in one embodiment, charging circuitry 12 responsively applies one or more current or charging signal to the battery/cell. (See, for example, FIGS. 2A and 2B). The charging circuitry 12 may also apply one or more charging signals (which provide a net input of charge or current into the battery/cell) and one or more discharging signals (which provide a net removal of charge or current from the battery/cell). (See, for example, FIGS. 2C and 2D).

The adaptive charging circuitry and techniques of the present inventions may employ any charging circuitry 12, whether described herein, now known or later developed, to charge the battery/cell; all such charging circuitry 12 are intended to fall within the scope of the present inventions. For example, charging circuitry 12 of the present inventions may generate charging and discharging signals, packets and pulses (as described herein). Notably, charging circuitry 12 is generally responsive to control signals from control circuitry 16.

Figure 3A:
FIGS. 3A-3N illustrate exemplary charge and/or discharge packets of the charging and discharging signals (which are exemplary illustrated in FIGS. 2A-2D), wherein such charge and discharge packets may include one or more charge pulses and one or more discharge pulses; notably, in one embodiment, each charge signal of FIGS. 2A-2D may include a plurality of packets (for example, about 100 to about 50,000 packets) and, in one embodiment, each packet may include a plurality of charge pulses, discharge pulses and rest periods; notably, the pulses may be any shape (for example, rectangular, triangle, sinusoidal or square); in one exemplary embodiment, the charge and/or discharge pulses of the packet may include a temporal duration of between about 1 ms to about 500 ms, and preferably less than 50 ms; moreover, as discussed in detail below, one, some or all of the characteristics of the charge and discharge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combinations or permutations of pulse, pulse characteristics, periods, packets and signal characteristics and configurations are intended to fall within the scope of the present inventions.
Figure 3B:
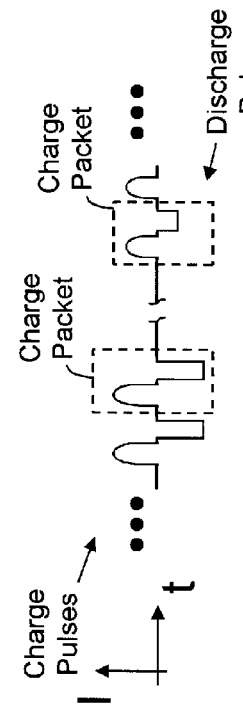
Figure 3C:
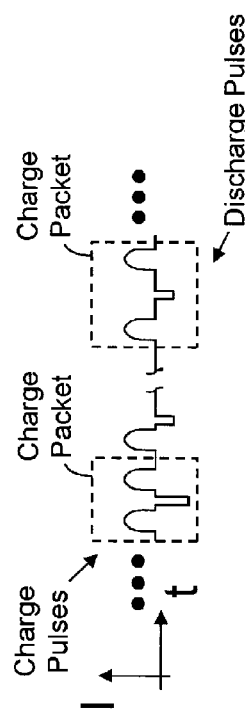
Figure 3D:
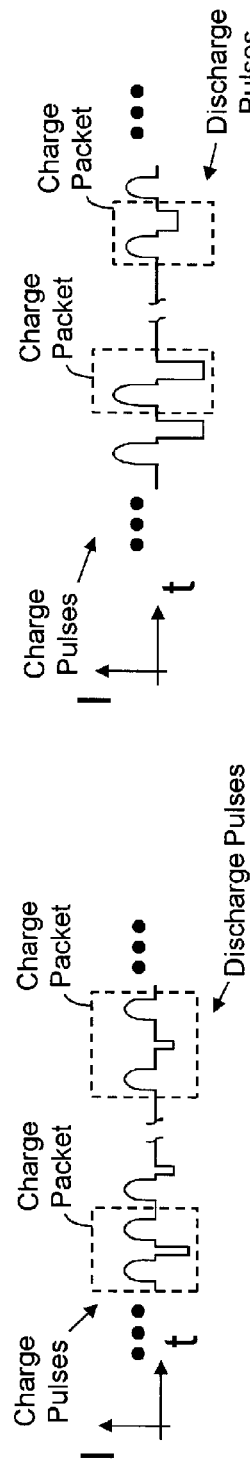
Figure 3E:
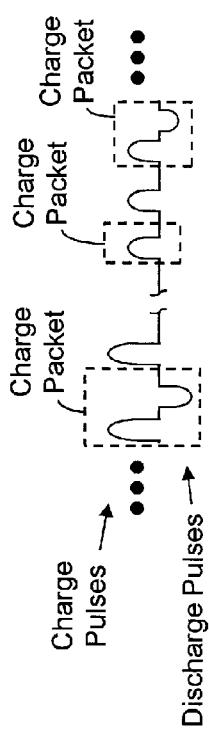
Figure 3K:
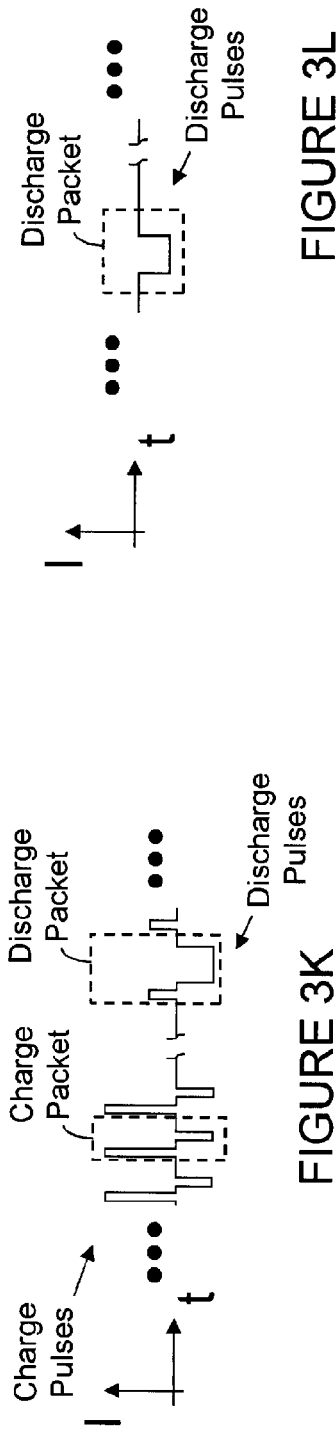
Figure 3L:
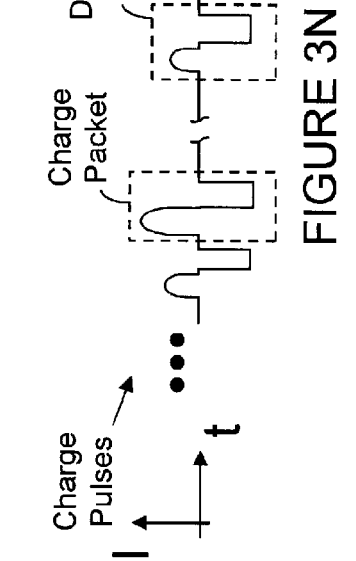
Figure 3M:
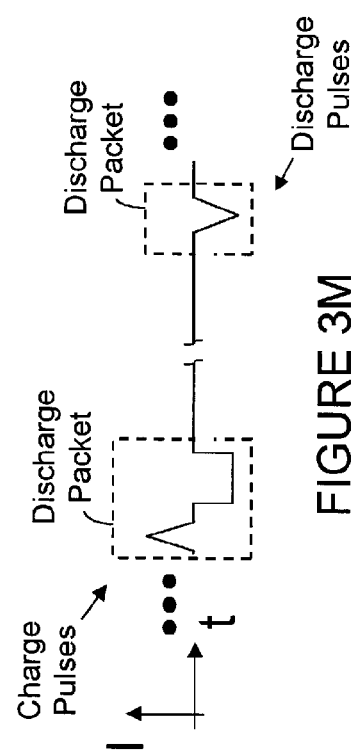
Figure 3N:
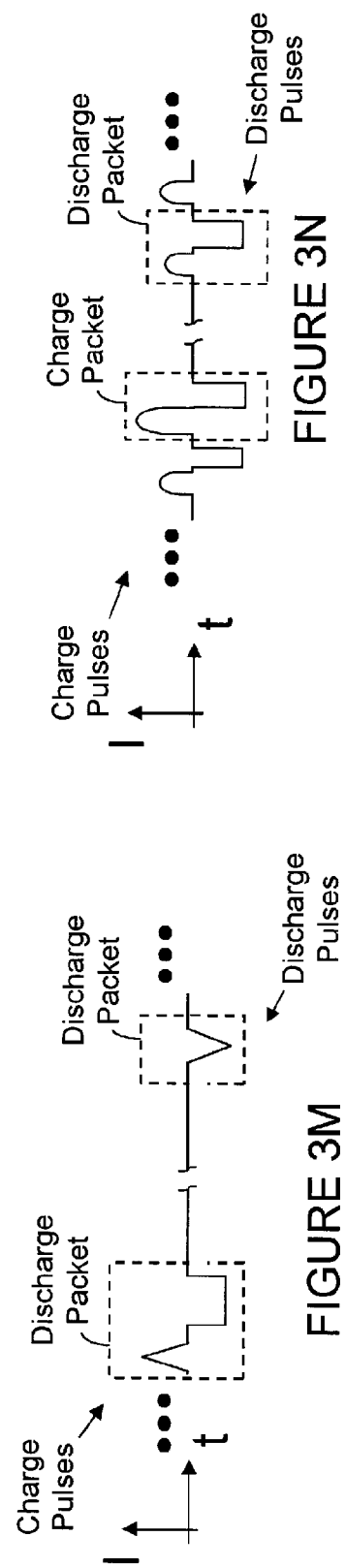

Although discussed in more detail below, with reference to FIGS. 3A-3J, the charging and discharging signals may include a plurality of charge packets wherein each charge packet includes one or more charge pulses and, in certain embodiments, one or more discharge pulses. The charging and discharging signals may also include one or more discharge packets wherein each discharge charge packet includes one or more discharge pulses. (See, FIGS. 3K-3N). Indeed, the charging and discharging signals may also include charge packets and one or more discharge packets wherein each charge packet and discharge packet includes one or more charge pulses and/or one or more discharge pulses. (See, FIGS. 3K and 3N).

With continued reference to FIG. 1A, monitoring circuitry 14 measures, monitors, senses, detects and/or samples (for example, on an intermittent, continuous and/or periodic basis) one or more conditions or characteristics of the battery/cell including, for example, the terminal voltage of the battery/cell, to detect, measure and/or determine the CPV of the battery/cell. Notably, the adaptive charging circuitry and techniques of the present inventions may employ any monitoring circuitry 14 and/or measuring or monitoring techniques, whether described herein, now known or later developed, to acquire such data; all such monitoring circuitry 14 and measuring or monitoring techniques are intended to fall within the scope of the present inventions. The monitoring circuitry 14 provides data which is representative of the condition or characteristics of the battery/cell to control circuitry 16. Moreover, monitoring circuitry 14 may include one or more temperature sensors (not illustrated) which is/are thermally coupled to the battery/cell to generate, measure and/or provide data which is representative of the temperature of the battery/cell.

The control circuitry 16, using data from monitoring circuitry 14, calculates, determines and/or assesses one or more conditions and/or states of the battery/cell, for example, in connection with or during the charging or recharging process. For example, control circuitry 16 calculates, determines and/or estimates the CPV of the battery/cell (in response to a charge pulse) and/or a change in the CPV of the battery/cell in response to a plurality of charge pulses (for example, sequential pulses or non-sequential pulses). Notably, control circuitry 16 may also calculate, determine and/or estimate one, some or all of the SOC of the battery/cell, SOH of the battery/cell, partial relaxation time of the battery/cell and/or overpotential or full relaxation time of the battery/cell as described in detail in, for example, PCT Application Serial No. PCT/US2012/30618, "Method and Circuitry to Adaptively Charge a Battery/Cell Using the State of Health Thereof", which is incorporated herein by reference.

The control circuitry 16 also calculates, determines and/or implements a charging sequence or profile based on or using the CPV of the battery/cell and one or more of the adaptive charging techniques and algorithms described herein. In this regard, control circuitry 16 adapts, adjusts and/or controls one or more characteristics of the charge or current applied to or injected into the battery/cell (via controlling the operation of charging circuitry 12) so that a CPV of the battery/cell (in response to a charge pulse applied to or injected into the battery/cell during a charging or recharging sequence/operation) and/or a change in CPV of the battery/cell is within a predetermined range and/or less than a predetermined upper limit value and/or greater than a predetermined lower limit value. In one embodiment, where charging circuitry 12 applies charge packets (each having at least one charge pulse) to the battery/cell, control circuitry 16 (implementing, for example, one or more of the inventive adaptive charging techniques described herein) adapts, adjusts and/or controls the characteristics of the charge packets applied to or injected into the battery/cell (via controlling charging circuitry 12) monitors a CPV of the battery/cell and/or a change in CPV of the battery/cell. Where the CPV of the battery/cell and/or the change in CPV of the battery/cell is not within a predetermined range and/or greater than a predetermined upper limit value and/or less than a predetermined lower limit value, the control circuitry instructs charging circuitry 12 to change the characteristics of the charge or current applied to or injected into the battery/cell via controlling the shape, amplitude and/or width of charge pulse(s). In this way, control circuitry 16 may, in one embodiment, adapt, adjust and/or control the charge or current applied to or injected into the battery/cell (via controlling charging circuitry 12) so that a CPV of the battery/cell and/or a change in CPV of the battery/cell (in response to charge or current pulse(s) applied to or injected into the battery/cell during a charging or recharging sequence/operation) is within a predetermined range and/or less than a predetermined upper limit value and/or greater than a predetermined lower limit value.

In another embodiment, charging circuitry 12 applies charge packets, having one or more charge pulses and one or more discharge pulses, to the battery/cell during a charging or recharging sequence, operation or cycle. In this embodiment, control circuitry 16 may adapt, adjust and/or control (i) the characteristics of charge pulses applied and/or (ii) the characteristics of the discharge pulse based on whether the CPV of the battery/cell and/or a change in CPV of the battery/cell is within a predetermined range and/or less than a predetermined upper limit value and/or greater than a predetermined lower limit value. Here again, control circuitry 16 (via control of charging circuitry 12) may adapt, adjust and/or control shape, amplitude and/or width of charge pulse(s) and the shape, amplitude and/or width of discharge pulse(s) in a manner so that (i) the CPV of the battery/cell due to subsequent charge pulse(s) and/or (ii) a change in CPV of the battery/cell due to the subsequent charge pulses are within predetermined ranges during the charging sequence and/or less than a predetermined upper limit value and/or greater than a predetermined lower limit value.

Notably, control circuitry 16 may include one or more processors, one or more state machines, one or more gate arrays, programmable gate arrays and/or field programmable gate arrays, and/or a combination thereof. Indeed, control circuitry and monitoring circuitry may share circuitry with each other as well as with other elements; such circuitry may be distributed among a plurality of integrated circuits which may also perform one or more other operations, which may be separate and distinct from that described herein. Moreover, control circuitry 16 may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by control circuitry 16 using any programming language whether now known or later developed, including, for example, assembly, FORTRAN, C, C++, and BASIC, whether compiled or uncompiled code; all of which are intended to fall within the scope of the present inventions.

In operation, charging circuitry 12 applies a charge or current to the battery/cell. (See, for example, the exemplary charge waveforms of FIGS. 2A-2D). The monitoring circuitry 14 measures or detects voltages at the terminals of the battery/cell to determine a CPV of the battery/cell in response to charge or current pulse(s) applied to or injected into the battery/cell during a charging or recharging sequence/operation. In this regard, in one embodiment, monitoring circuitry 14 measures the terminal voltage of the battery/cell (for example, during and immediately after terminating the charge pulse) to facilitate detecting and/or determining the CPV of the battery/cell. The control circuitry 16, using the terminal voltages measured by monitoring circuitry 14, determines and/or detects (i) the CPV of the battery/cell and/or (ii) a change in CPV of the battery/cell. The control circuitry 14 also determines and/or assesses whether the CPV and/or change in CPV of the battery/cell is within a predetermined range, and/or less than a predetermined upper limit value and/or greater than a predetermined lower limit value. Where the CPV of the battery/cell and/or change in CPV of the battery/cell satisfies the criteria, in one embodiment, instructs charging circuitry 12 to apply the same or similar charge packet to the battery/cell during subsequent charging. Where, however, the change in terminal voltage is outside or exceeds the predetermined range (for example, is less than the predetermined lower limit or is greater than the predetermined upper limit), control circuitry 16 adapts, adjusts and/or controls one or more characteristics of the charge or current applied to or injected into the battery/cell (via charging circuitry 12) so the CPV and/or change in CPV of the battery/cell in response to subsequent charging (for example, the immediately subsequent charge packet) is within a predetermined range, and/or less than a predetermined upper limit value and/or greater than a predetermined lower limit value. Here, control circuitry 16 implements, calculates and/or determines a change to one or more characteristics of the packet so that charge or current applied to or injected into the battery/cell via subsequent charging provides a CPV and/or change in CPV of the battery/cell in response thereto satisfies the aforementioned criteria.

Notably, the predetermined range, upper limit value and/or lower limit value may change, for example, according to a predetermined rate or pattern—for example, based on a particular battery/cell type or manufacturer. Indeed, the predetermined range, upper limit value and/or lower limit value may change according to a SOC and/or SOH of the battery/cell (which may be measured, determined and/or estimated).

Figures 4A, 4B:
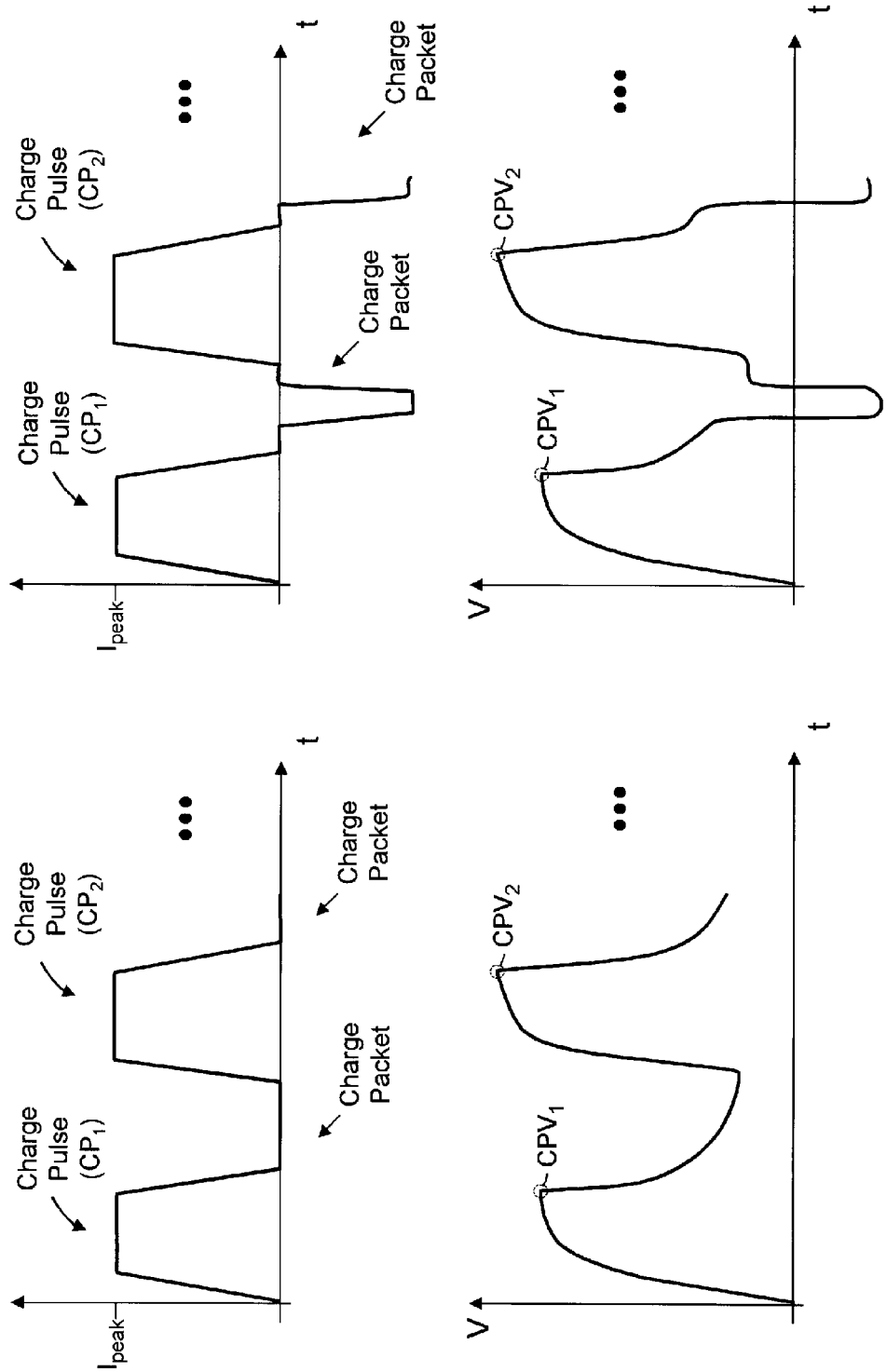
FIGS. 4A and 4B illustrate the response of a battery/cell to a plurality of charge pulses of a charge cycle wherein one or more CPVs of the battery/cell (which are responsive to the charge pulses applied to the battery/cell) may be analyzed to determine whether to adjust, adapt, change and/or control one or more characteristics of the charge or current applied to or injected into the battery/cell during a charging or recharging sequence, operation or cycle.
Figure 5A:
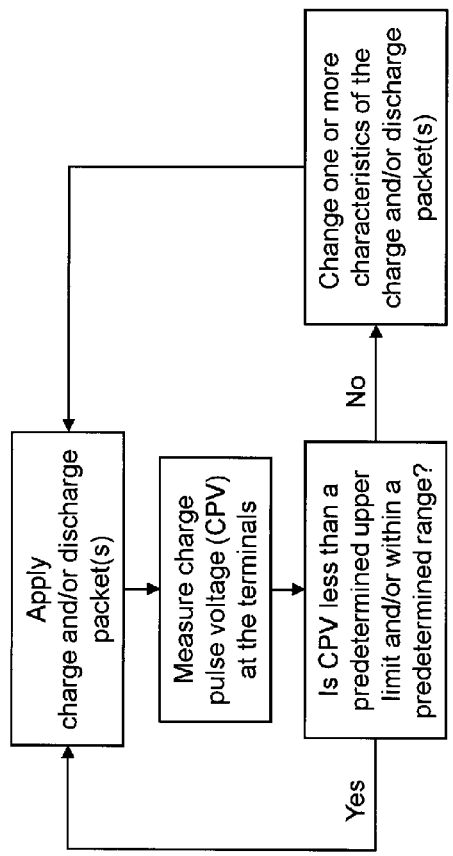
FIGS. 5A, 5C and 5E are flowcharts of exemplary processes of determining, adapting and/or controlling the characteristics of a charging current based on or using a CPV of the battery/cell in response to a charge pulse (which, in one embodiment, may be included in a charge and/or discharge packet wherein such packets may include one or more charge pulses (and may also include one or more discharge pulses)), according to certain aspects of the present inventions; wherein the charging techniques and/or circuitry adapt, adjust and/or control one or more characteristics of the charge or current applied to or injected into the battery/cell so that CPV of the battery/cell in response to subsequent charge packets is (i) less than a predetermined upper limit value and/or within a predetermined range during a charging or recharging sequence, operation or cycle (FIG. 5A) and/or (ii) greater than a predetermined lower limit value and/or within a predetermined range during a charging or recharging sequence, operation or cycle (FIG. 5C) and/or (iii) less than a predetermined upper limit value and greater than a predetermined lower limit value during a charging or recharging sequence, operation or cycle (FIG. 5E)
Figure 5B:
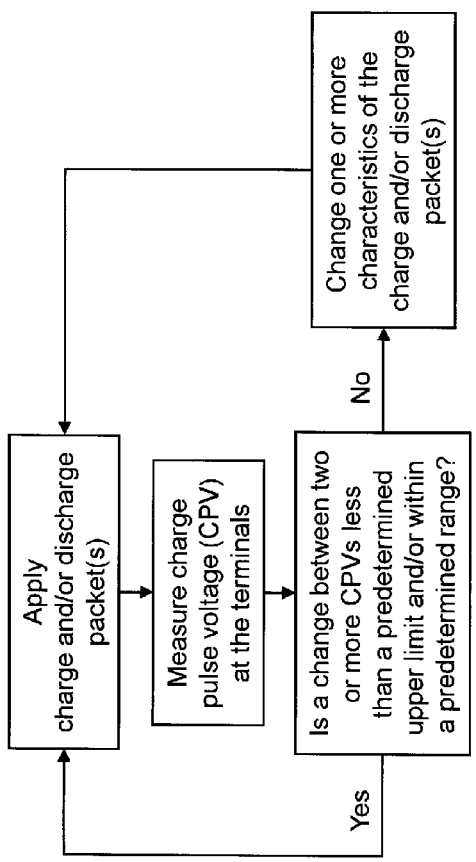
FIGS. 5B, 5D and 5F are flowcharts of exemplary processes of determining, adapting and/or controlling the characteristics of a charging current based on or using a change in CPV of the battery/cell in response to a plurality of charge pulses (which, in one embodiment, may be included in a plurality of charge and/or discharge packets wherein such packets may include one or more charge pulses (and may also include one or more discharge pulses)), according to certain aspects of the present inventions; wherein the charging techniques and/or circuitry adapt, adjust and/or control one or more characteristics of the charge or current applied to or injected into the battery/cell so that such change between two or more CPVs of the battery/cell, in response subsequent charge packets, is (i) less than a predetermined upper limit value and within a predetermined range (FIG. 5B), (ii) greater than a predetermined lower limit value and within a predetermined range (FIG. 5D), and/or (iii) less than a predetermined upper limit value and greater than a predetermined lower limit value during a charging or recharging sequence, operation or cycle (FIG. 5F); notably, the charge pulses may be sequential or non-sequential pulses of a charge cycle and/or contained in sequential or non-sequential charge or discharge packets.
Figure 5C:
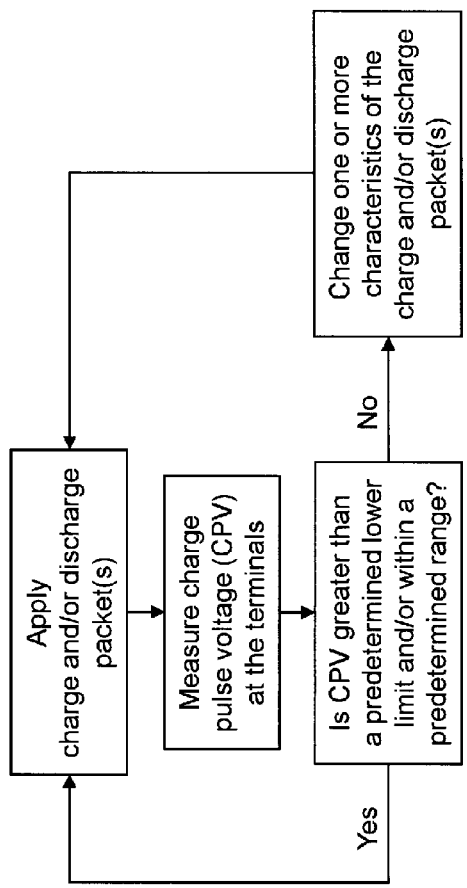
Figure 5D:
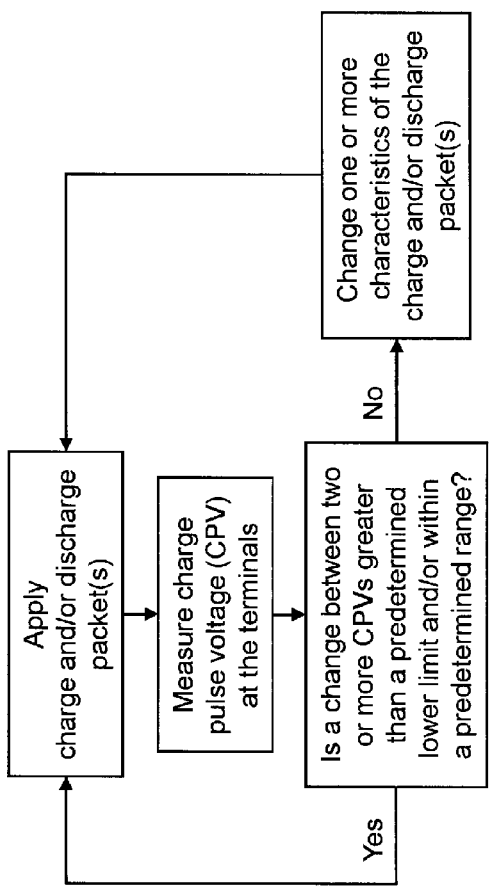
Figure 5E:
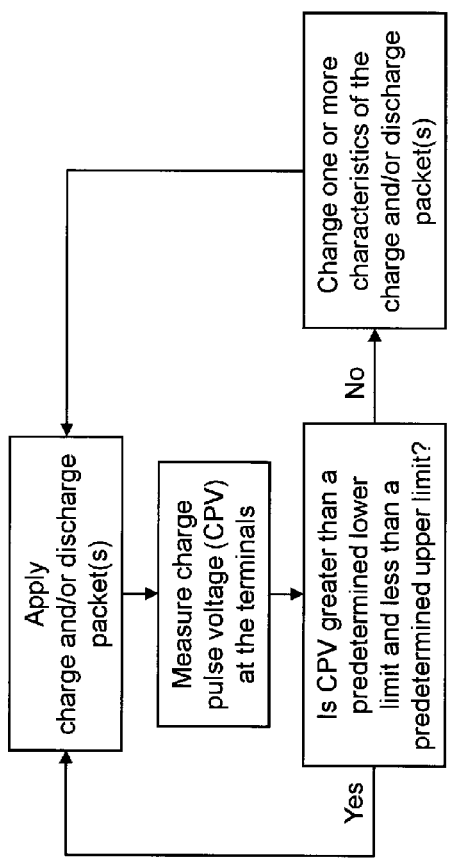
Figure 5F:
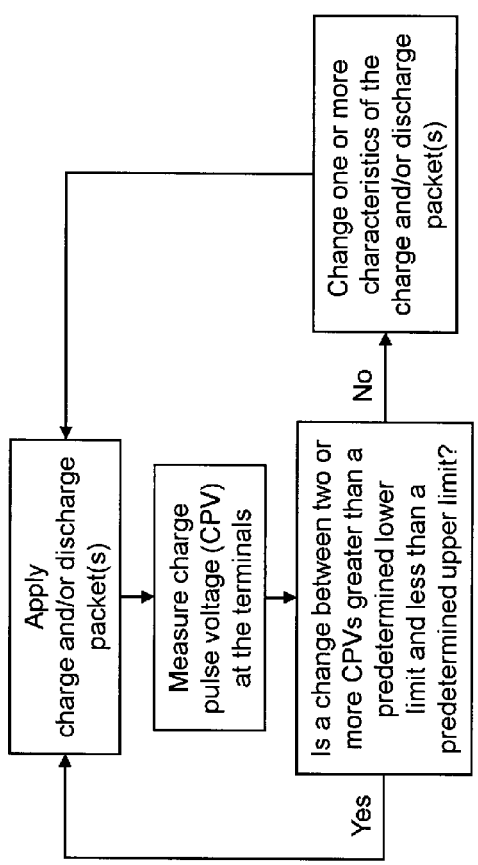

In particular, with reference to FIGS. 1A and 4A, in one embodiment, monitoring circuitry 14 measures, samples and/or determines the terminal voltage response to the charge pulse and provides data which is representative of a $CPV_1$, which correlates to a peak voltage, measured at the terminals of the battery/cell, which is in response to an associated charge pulse to control circuitry 16. Based on or using such data, control circuitry 16 (which, in one embodiment, includes a peak voltage detector (for example, a digital or analog type detector)) calculates, determines and/or estimates $CPV_1$ due to the associated charge pulse. The control circuitry 16 determines whether $CPV_1$ is within a predetermined range, greater than a predetermined upper limit value and/or less than a predetermined lower limit value. (See, for example, FIGS. 5A-5F). Where control circuitry 16 calculates, determines and/or estimates the $CPV_1$ satisfies the aforementioned criteria, control circuitry 16 may maintain the characteristics of the previous charge packet in connection with the immediately subsequent charge packet (although control circuitry 16 may indeed change such characteristics as a result of other considerations, such as, for example, considerations measurements of relaxation time to partial equilibrium and/or SOC and/or SOH).

Where, however, control circuitry 16 determines the $CPV_1$ does not satisfy one or more of the aforementioned criteria (i.e., within a predetermined range, greater than a predetermined upper limit value and/or less than a predetermined lower limit value), control circuitry 16 may change one or more characteristics of the charge packet including the shape, amplitude and/or width of charge pulse(s) to adapt, adjust and/or control the charge or current applied to or injected into the battery/cell (via charging circuitry 12) so that the CPV of the battery/cell in response to a subsequent charge pulse satisfies the aforementioned criteria. (See, for example, FIGS. 5A-5F). For example, where CPV of the battery/cell in response to one or more charge pulses of a charge packet is greater than a predetermined upper limit value (see, for example, FIG. 6A), control circuitry 16 may decrease the amplitude and/or width of the charge pulse(s) to thereby inject less charge into the battery/cell in a subsequent packet (for example, the immediately subsequent packet). Alternatively, where CPV of the battery/cell in response to one or more charge pulses of a charge packet is less than a predetermined lower limit value (see, for example, FIG. 6B), control circuitry 16 may increase the amplitude and/or width of the charge pulse(s) to thereby inject more current or charge into the battery/cell in a subsequent packet (for example, the immediately subsequent packet).

Notably, control circuitry 16 adapts the charge sequence via one or more modifications to the charge pulse and/or charge packet—for example, where the CPV is less than the predetermined range, the control circuitry may increase the amplitude and decrease the width of the charge pulse(s) to thereby inject the same amount of current or charge into the battery/cell in a subsequent packet (for example, the immediately subsequent packet) but at a higher amplitude relative to the previous packet/pulse. Similarly, where the CPV is greater than the predetermined range, control circuitry 16 may decrease the amplitude and increase the width of the charge pulse(s) to thereby inject the same amount of current or charge into the battery/cell in a subsequent packet (for example, the immediately subsequent packet) but at a lower amplitude relative to the previous pulse. Indeed, with reference to FIG. 7A, in one embodiment, control circuitry 16 may adapt, adjust and/or control the amplitude and/or duration of the charge pulse as well as the duration of the rest period ($T_{rest}$). For example, in one embodiment, control circuitry 16, via charging circuitry 12, adjusts the amplitude and duration of the charge pulse and the duration of the rest period ($T_{rest}$) to maintain a constant period of the charge packet ($T_{packet}$). Alternatively, control circuitry 16 may adapt, adjust and/or control the duration of the rest period ($T_{rest}$) to accommodate other considerations and parameters in relation to the response of the battery/cell to charging (for example, overpotential or full relaxation time (relative to full or complete equilibrium of the battery/cell) and/or relaxation time (to partial-equilibrium of the battery/cell)). (See, for example, application Ser. No. 13/366,352 "Method and Circuitry to Calculate the State of Charge of a Battery/Cell", which is incorporated herein by reference).

Figures 7A, 7B:
FIG. 7A illustrates an exemplary charge packet having a charge pulse including a charging period ($T_{charge}$) followed by a rest period ($T_{rest}$) wherein the period of the charge packet is identified as $T_{packet}$, according to certain aspects of the present inventions; an exemplary voltage response of the battery/cell to such charge packet is illustrated wherein a CPV is identified (which, in this embodiment correlates to a peak or substantial peak terminal voltage of the battery/cell); notably, as discussed in detail below, one, some or all of the characteristics of the charge pulses (for example, pulse amplitude, pulse width/duration and pulse shape) are programmable and/or controllable via charging circuitry wherein the amplitude of the positive pulse may vary between packets (and are programmable and/or controllable), the duration and/or timing of the rest periods may vary within the packet (and are programmable and/or controllable) and/or, in addition, such pulses may be equally or unequally spaced between the packets; the combination of charging pulses and rest periods may be repetitive and thereby forms a packet that may be repeated; all combinations or permutations of pulse, pulse characteristics, periods, packets and signal characteristics and configurations are intended to fall within the scope of the present inventions.
FIG. 7B illustrates an exemplary charge packet having a charge pulse (which injects charge into the battery/cell) and a discharge pulse (which removes charge from the battery/cell) wherein the charge pulse includes a charging period ($T_{charge}$) and the discharge pulse includes a discharging period ($T_{discharge}$), according to certain aspects of the present inventions; notably, in this exemplary charge packet, an intermediate rest period ($T_{inter}$) is disposed between the charge and discharge pulses, and a rest period ($T_{rest}$) is disposed after the discharge pulse and before the next packet; an exemplary terminal voltage response of the battery/cell to such charge packet is illustrated wherein a CPV is identified (which, in this embodiment correlates to a peak or substantial peak terminal voltage of the battery/cell); notably, as discussed in detail below, one, some or all of the characteristics of the charge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combinations or permutations of pulse, pulse characteristics, periods, packets and signal characteristics and configurations are intended to fall within the scope of the present inventions; moreover, discharge packets may have similar characteristics as charge packets except, however, a net charge is removed from the battery/cell; for the sake of brevity, the discussion/illustration with respect to discharge packet will not be repeated.

In another embodiment, where the charge packet includes one or more discharge pulses, control circuitry 16 may adapt, adjust and/or control one or more characteristics of the charge pulse(s) and/or discharge pulse(s) (for example, the shape, amplitude and/or width of charge pulse(s) and/or discharge pulse(s)), via controlling charging circuitry 12, to provide a CPV which satisfies the aforementioned criteria (i.e., within a predetermined range, less than a predetermined upper limit value and/or greater than a predetermined lower limit value). With reference to FIG. 7B, control circuitry 16 may change the characteristics of the pulse(s) while maintaining an amount of current injected into the battery/cell and/or an amount of charge or current removed from the battery/cell constant or substantially constant relative to immediately subsequent packets. Alternatively, control circuitry 16 may change the characteristics of the pulse(s) and change an amount of charge or current applied to or injected into the battery/cell and/or an amount of charge or current removed from the battery/cell so that the change in voltage in response to subsequent packet(s) is within one or more predetermined ranges and/or below one or more predetermined values.

As such, in this embodiment, control circuitry 16 may adapt, adjust and/or control shape, amplitude and/or width of charge pulse(s) and the shape, amplitude and/or width of discharge pulse(s) (via controlling charging circuitry 12) in a manner so that the CPV of the charge pulse of the charge packet is within a predetermined range, less than a predetermined upper limit value and/or greater than a predetermined lower limit value. In addition, control circuitry 16 may control the duration of one or both of the rest periods ($T_{inter}$ and $T_{rest}$). In one embodiment, control circuitry 16, via charging circuitry 12, adjusts the amplitude and width of the charge and/or discharge pulses and duration of one or both of the rest periods ($T_{inter}$ and $T_{rest}$) to maintain a constant period of the charge packet ($T_{packet}$). Alternatively, control circuitry 16 may adapt, adjust and/or control the amplitude and/or duration of the charge and/or discharge pulses in relation to the change in CPV of the battery/cell as well as adapt, adjust and/or control the duration of one or both of the rest periods ($T_{inter}$ and $T_{rest}$) to, for example, accommodate other considerations and parameters in relation to the response of the battery/cell to charging (for example, overpotential or full relaxation time (relative to full or complete equilibrium of the battery/cell) and/or relaxation time (to partial-equilibrium of the battery/cell)). (See, for example, application Ser. No. 13/366,352 "Method and Circuitry to Calculate the State of Charge of a Battery/Cell").

In addition to consideration of the CPV of the battery/cell, or in lieu thereof, the control circuitry may employ a change in CPV in relation to a plurality of charge pulses to determine whether to adapt, modify and/or change the charge sequence, cycle or operation. In this regard, with reference to FIG. 1A and FIGS. 4A and 4B, monitoring circuitry 14 may measure, sample and/or determine the terminal voltage of the battery/cell in response to the plurality of charge pulses—including the CPV of associated charge pulses. Based on or using such data, control circuitry 16 (which, as noted above, may include a peak voltage detector (which may be a digital or analog type detector)) calculates, determines and/or estimates $CPV_1$ responsive to an associated first charge pulse ($CP_1$) and $CPV_2$ responsive to an associated second charge pulse ($CP_2$). The control circuitry 16 determines whether a change in CPV is within a predetermined range, greater than a predetermined upper limit value and/or less than a predetermined lower limit value. (See, for example, FIGS. 5A-5F). Where control circuitry 16 calculates, determines and/or estimates the change in CPV satisfies the aforementioned criteria, control circuitry 16 may maintain the characteristics of the previous charge packets in connection with the immediately subsequent charge packets (although control circuitry 16 may indeed change such characteristics as a result of other considerations, such as, for example, considerations measurements of relaxation time to partial equilibrium and/or SOC and/or SOH). Where, however, control circuitry 16 calculates, determines and/or estimates the change in CPV does not satisfy one or more of the aforementioned criteria, control circuitry 16 may adapt, adjust and/or control the charge as described herein in connection with charge packets. That is, control circuitry 16 adjusts the characteristics of the charge pulse(s) to control, adjust and/or provide a change in CPV, in response to charge pulses of subsequent charge packets, which is within a predetermined range, and/or less than a predetermined upper limit value and/or greater than a predetermined lower limit value.

Notably, the control circuitry may calculate, determine and/or estimate a change in CPV using CPVs of (i) associated charge pulses of sequential charge packets (see, for example, FIGS. 4A and 4B) and/or (ii) associated charge pulses of non-sequential charge packets (see, for example, FIGS. 4C and 4D). Moreover, as noted above, the control circuitry may consider a CPV (absolute CPV evaluation) as well as a change in CPV (relative CPV evaluation) when determining whether to adapt, adjust and/or control the charge injected into or applied to the battery/cell in connection with charge sequence, cycle or operation.

As mentioned herein, control circuitry 16 may adapt, adjust and/or control the characteristics of subsequent charge or current applied to or injected into the battery/cell based on or using an averaged response of the battery/cell in connection with a plurality of pulses in the packet and/or a plurality of packets. For example, control circuitry 16 may adapt, adjust and/or control the shape, amplitude and/or width of charge pulse(s) generated by charging circuitry 12 and applied to the battery/cell by charge packets so that the average change in CPV in connection with the plurality of charge pulses over a plurality of charge packet is within a predetermined range and/or less than a predetermined upper limit value and/or greater than a predetermined lower limit value. Similarly, the charging techniques and/or circuitry of the present inventions may adapt, adjust and/or control the charge or current applied to or injected into the battery/cell by a plurality of charge pulses of a packet so that the change in CPV of the battery/cell averaged over a plurality of charge pulses of the packet satisfies the aforementioned criteria.

The control circuitry 16 may employ any form of averaging now known or later developed; all of which are intended to fall within the scope of the present inventions. For example, control circuitry 16 may employ discrete or mutually exclusive groups of packets or "rolling" averages wherein the charging techniques and/or circuitry determine or calculate a "new" average as a CPV of the battery/cell and/or a change in CPV, in response to a charge packet. Again, all forms of averaging and averaging techniques are intended to fall within the scope of the present inventions.

Notably, the discussion with respect to the charge packets is applicable to control of the pulses of a discharge packet. In this regard, control circuitry 16 may adapt, adjust and/or control one or more characteristics of the discharge packets so that the CPV of the battery/cell in response to a charge pulse of a discharge packet is within a predetermined range and/or below a predetermined upper limit value and/or above a predetermined lower limit value. As mentioned herein, the discharge packets include one or more discharge pulses (see, for example, FIGS. 3K-3N) as well as one or more charge pulses in addition to the discharge pulse(s) (see, for example, 3K, 3M and 3N).

Briefly, in operation, similar to the charge packets, monitoring circuitry 14 measures, samples and/or determines the CPV of the battery/cell in response to a charge pulse of a discharge packet and provides data which is representative thereof to control circuitry 16, which determines the CPV of the battery/cell in response to the associated charge pulse of the discharge packet. The operation is the same to that described herein in connection with a charge packet. For the sake of brevity, such discussion will not be repeated.

Notably, the predetermined range, upper limit value and/or lower limit value may be fixed or may change or be adjusted, for example, over time or use and/or based on one or more conditions or states of the battery/cell (for example, SOC and/or SOH) and/or responses of the battery/cell to or during charging. In one embodiment, the predetermined range is based on empirical data, test data, simulation data, theoretical data and/or a mathematical relationship. For example, based on empirical data, control circuitry 16 associated with the battery/cell may determine, calculate and/or employ predetermined ranges based on one or more conditions or states of the battery/cell (for example, the SOC and/or SOH of the battery/cell) and/or responses of the battery/cell to or during charging. Such predetermined range, upper limit value and/or lower limit value may be fixed (for example, conform to a fixed or predetermined pattern) or may be variable.

In one embodiment, the changes in the predetermined range, upper limit value and/or lower limit value may be based on one or more conditions or states of the battery/cell and/or responses of the battery/cell to or during the charging process. For example, the predetermined ranges may change and/or adapt based on or according to one or more parameters of the battery/cell including, for example, the SOC, the SOH, overpotential or full relaxation time (relative to full or complete equilibrium of the battery/cell) and/or relaxation time (to partial-equilibrium of the battery/cell). Indeed, in one embodiment, where the battery/cell is a typical rechargeable lithium-ion (Li+) battery/cell employing a conventional chemistry, design and materials, a predetermined range, upper limit value and/or lower limit value may be dependent on the SOC of the battery/cell—for example, the predetermined range, upper limit value and/or lower limit value may change in accordance with a SOC (for example, a first set of criteria when the SOC is between 0-10%, (ii) a second set of criteria when the SOC is between 10-20%, (iii) a first third of criteria when the SOC is between 20-30%, (iv) a fourth set of criteria when the SOC is between 30-50%, (v) a fifth set of criteria when the SOC is between 50-60%, (vi) a sixth set of criteria when the SOC is between 60-70%, (vii) a seventh set of criteria when the SOC is between 70-80%, (viii) an eighth set of criteria when the SOC is between 80-90%, (ix) a ninth set of criteria when the SOC is between 90-100%).

Thus, in one embodiment, control circuitry 16 may calculate, determine and/or employ one or more predetermined ranges, upper limit values and/or lower limit values based on the status or state of the battery/cell (for example, based on or using data which is representative of the SOC of the battery/cell, the SOH of the battery/cell, overpotential and/or relaxation time). That is, the predetermined range, upper limit value and/or lower limit value employed by control circuitry 16 and upon which the change in CPV of the battery/cell is evaluated, may depend on status or state of the battery/cell, for example, the SOC of the battery/cell and the SOH of the battery/cell.

In one embodiment, based on or using initialization, characterization and/or calibration data, control circuitry 16 or external circuitry may calculate or determine an initial set of predetermined ranges, upper limit values and/or lower limit values for the particular battery/cell. For example, in one embodiment, based on or using (i) initialization, characterization and/or calibration data and (ii) empirical data, test data, simulation data, theoretical data and/or a mathematical relationship, control circuitry 16 or external circuitry may calculate or determine a set of criteria for a particular or associated battery/cell. Such predetermined range, upper limit value and/or lower limit value may be based on one or more states of the battery/cell (for example, SOC of the battery). The control circuitry may adaptively adjust the predetermined ranges, upper limit values and/or lower limit values over the life or use of the battery/cell—for example, based on the changing conditions of the battery/cell (for example, a measured SOH of the battery/cell).

Notably, a set of predetermined ranges, upper limit values and/or lower limit values may be calculated or determined by control circuitry 16 or by circuitry other than control circuitry 16 (for example, circuitry which is "off-device" or "off-chip" relative to control circuitry 16). The predetermined ranges may be stored in memory (for example, in a database or look-up table) during manufacture, test or calibration, and accessible to the adaptive circuitry and/or processes of the present inventions during operation.

In one embodiment, a set of predetermined ranges, upper limit values and/or lower limit values (based on, for example, SOC of the battery) may be calculated or determined and stored in memory (for example, during manufacture, test or calibration). Thereafter, the control circuitry may adjust or adapt the set of ranges and limits based on the condition of the battery/cell—for example, the SOH of the battery/cell. Alternatively, the memory may store multiple sets of predetermined ranges and limits (for example, in a look-up table or matrix) and control circuitry 16 employs a given predetermined range and/or limit(s) based on one or more conditions of the battery/cell—including SOC and SOH of the battery/cell. Thus, in this embodiment, the predetermined ranges and limits employed by control circuitry 16 depends on the SOH of the battery/cell, which designates or "identifies" a set of predetermined ranges and limits, and the SOC of the battery/cell which designates or "identifies" the particular predetermined range and limit(s) within the set of predetermined ranges and limits. In these embodiments, the control circuitry adapts the control of the charging process based on or in response to a degrading SOH of the battery/cell. The set of predetermined ranges and/or limits or the particular predetermined range/limit may also be depend on other considerations such as the state or status of other parameters of the battery/cell including, for example, the overpotential, relaxation time and/or temperature of the battery/cell (for example, in one embodiment, the predetermined ranges may increase with an increase in temperature of the battery/cell).

The predetermined ranges and limit(s) may be stored in any memory now known or later developed; all of which are intended to fall within the scope of the present inventions. For example, the memory may be a permanent, semi-permanent or temporary memory (for example, until re-programmed). In one embodiment, the memory may be one-time programmable, and/or the data, equations, relationships, database and/or look-up table of the predetermined range(s) may be stored in a one-time programmable memory (for example, programmed during test or at manufacture). In another embodiment, the memory is more than one-time programmable and, as such, the predetermined range(s) and/or limit(s) may be updated, written, re-written and/or modified after initial storage (for example, after test and/or manufacture) via external or internal circuitry.

With reference to FIGS. 1A-1C, memory 18 may be integrated or embedded in other circuitry (for example, control circuitry 16) and/or discrete. The memory 18 may be of any kind or type (for example, EEPROM, Flash, DRAM and/or SRAM). The memory 18 may store data which is representative of the predetermined ranges/limit(s), equations, and relationships. Such data may be contained in a database and/or look-up table.

Thus, in one embodiment, a correlation of the CPV and/or change in CPV to the SOC of the battery/cell may be based on empirical data, test data, simulation data, theoretical data and/or a mathematical relationship. For example, based on empirical data, the circuitry associated with a given battery/ cell (for example, a certain series, manufacturing lot, chemistry and/or design) may determine, calculate and/or employ a predetermined correlation. In another embodiment, based on or using initialization, characterization and/or calibration data, control circuitry or circuitry external to the system may calculate or determine a correlation of a measured CPV and/or change in CPV to the SOC of the battery/cell. In one embodiment, for example, based on or using (i) initialization, characterization and/or calibration data and (ii) empirical data, test data, simulation data, theoretical data and/or a mathematical relationship, the control circuitry (or external circuitry) may calculate, estimate or determine a correlation of a measured CPV and/or change in CPV to the SOC for a particular or associated battery/cell. Indeed, in one embodiment, the control circuitry may adaptively adjust the correlation of a measured CPV and/or change in CPV to the SOC over the life or use of the battery/cell—for example, based on the changing conditions of the battery/cell (for example, a measured SOH of the battery/cell).

In another embodiment, an initial predetermined CPV range/limits or set of predetermined CPV ranges/limits for a particular battery/cell may be based on or using initialization, characterization or calibration data of the battery/cell. The initialization, characterization and/or calibration data may be representative of the response of the battery/cell to a characterization sequence. In one embodiment, the characterization sequence may apply charge signals to the battery/cell. Thereafter, the adaptive charging techniques and/or circuitry may evaluate the response to such signals by the battery/cell (including the CPV and/or change in CPV of the battery/cell). Based thereon, the adaptive charging techniques and/or circuitry may calculate or determine predetermined overpotential ranges for the particular battery/cell. Such initialization, characterization or calibration data may be obtained, acquired and/or determined, for example, at manufacture, test or calibration which may include the characterization sequence to obtain "unique" data regarding a given battery/cell.

As noted herein, in certain embodiments, two considerations in connection with implementing the adaptive charging circuitry and techniques of the present inventions include (i) minimizing and/or reducing total charging time and (ii) maximizing and/or increasing cycle life. Under certain circumstances, it is desirable to charge the battery/cell at the slowest possible charge rate in order to extend its cycle life. For practical reasons, however, the user may desire to charge the battery/cell within a given period of time (for example, a maximum allowed period of time). Typically, a specification value is defined, selected and/or chosen depending on the application of the battery/cell. For example, it is approximately 2 to 4 hours for conventional batteries employed in consumer applications, and for conventional batteries employed in transportation applications, it may be up to 8 hours. This results in a specification for a net effective charging current. Moreover, to maximize and/or increase cycle life of the battery/cell, it may be desirable to charge the battery/cell (i) at a low current and/or (ii) provide relaxation or rest periods between charging periods. Thus, in certain aspects, the charging circuitry of the present inventions implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions. Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the adaptive charging techniques and circuitry of the present inventions may monitor and/or determine one or more (or all) of the parameters discussed herein (including, for example, (i) CPV (and/or change in CPV) in response to one or more charge pulses, (ii) partial relaxation time, (iii) SOC of the battery/cell, (iv) full relaxation time or overpotential and/or (v) SOH (or changes therein) of the battery/cell) and responsively adapt the characteristics of the charging sequence (for example, the amount of charge, length and relative location of rest periods, the amplitude of the charging signals, the duration or width of the charge or charging signals and/or shape of the charging signals) to control one or more (or all) of such parameters. The present inventions are neither limited to any combination and/or permutation of such monitoring and/or adaptation. Indeed, the control circuitry may employ such techniques and/or control such parameters in any combination; all combinations or permutations thereof are intended to fall within the scope of the present inventions.

For example, in one embodiment, the control circuitry, using the state or status of one or more (or all) of the aforementioned parameters which are determined at differing rates, adapts, adjusts and/or controls the characteristics of the charge injected into the battery/cell (via controlling, for example, the shape, amplitude and/or duration of the current signal output by the charging circuitry). With reference to FIG. 8A-8E, the control circuitry may implement one or more adaptation loops to determine whether to adapt, adjust and/or control the characteristics of the charge injected into the battery/cell (via control of the charging circuitry). For example, the control circuitry may employ a first adaption loop which monitors and/or determines a CPV (or change in CPV) in response to one or more charge pulses (of, for example, one or more packets) and/or the partial relaxation time to responsively adapt the characteristics of the charging sequence. (See, for example, FIG. 9A). Here, the control circuitry may monitor and/or determine the parameters of the first loop and/or responsively adapt the characteristics of the charging sequence based on or using the parameters of the first loop at a first rate (for example, on application of a charge pulse or a number of charge pulses).

In addition thereto, or in lieu thereof, the control circuitry may employ a second adaption loop which determines or estimates the SOC of the battery/cell and/or the full relaxation time or overpotential to responsively adapt the characteristics of the charging sequence. (See, for example, FIG. 9B). Here, the control circuitry may monitor and/or determine or estimate the parameters of the second loop and/or responsively adapt the characteristics of the charging sequence based on or using the parameters of the second loop at a second rate (which is less than the first rate—for example, 1 to 1000 seconds).

The control circuitry may, in addition thereto or in lieu thereof, employ a third adaption loop which determines or estimates the SOH (or changes therein) of the battery/cell to responsively adapt the characteristics of the charging sequence. (See, for example, FIG. 9C). Here, the control circuitry may monitor and/or determine or estimate the parameter of the third loop and/or responsively adapt the characteristics of the charging sequence based on or using the parameter of the third loop at a third rate (which is less than the first and second rates—for example, after a predetermined number of charge and/or discharge cycles (for example, 1-10 charge and/or discharge cycles)).

Notably, the control circuitry may, in addition thereto or in lieu thereof, employ a fourth adaption loop which determines or estimates the temperature (or changes therein) of the battery/cell during charging to responsively adapt the characteristics of the charging sequence. (See, for example, FIG. 9D). Here, the control circuitry may monitor and/or determine or estimate the temperature of the battery/cell and/or responsively adapt the characteristics of the charging sequence based on or using the temperature of the battery/cell at a fourth rate (which is different from the first, second and/or third rates—for example, every 5 minutes and/or during a SOC determination or estimation).

Figure 8D:
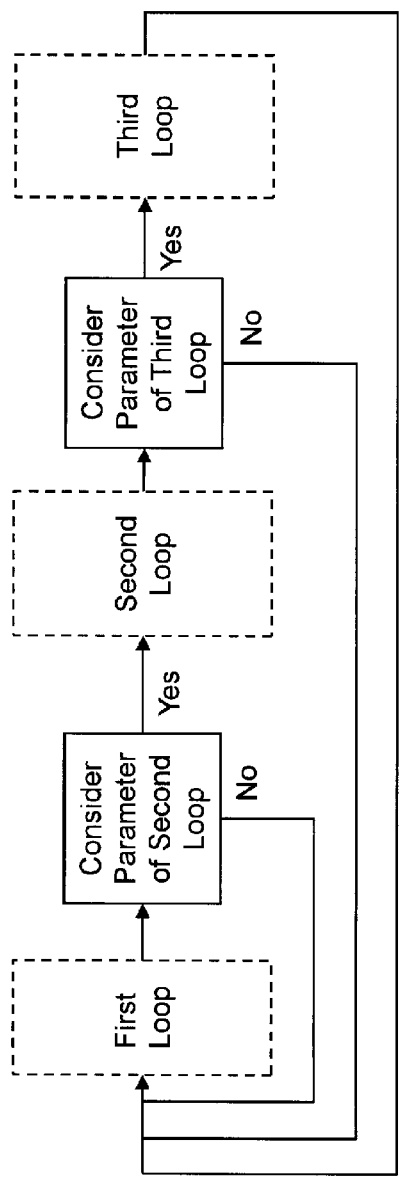
Figure 8E:
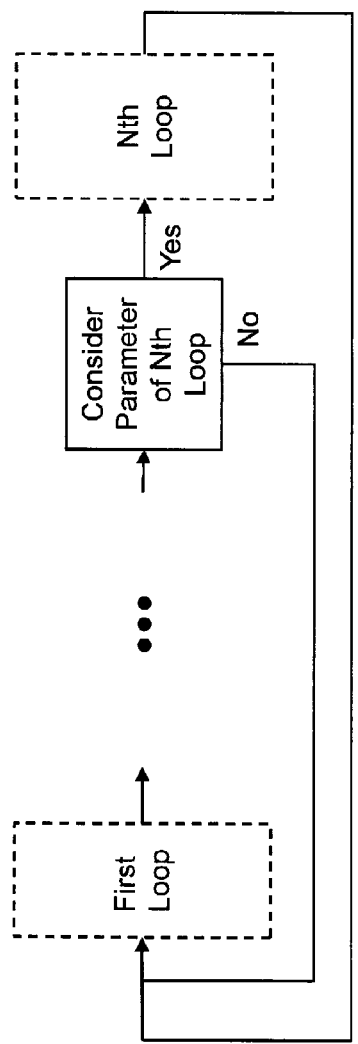
Figure 10A:
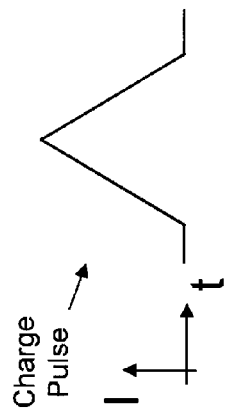
FIGS. 10A-10D illustrate exemplary charge pulses having different shapes and pulse widths; all combinations or permutations of charge pulse characteristics are intended to fall within the scope of the present inventions.
Figure 10B:
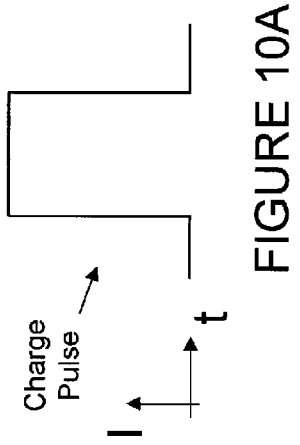
Figure 10C:
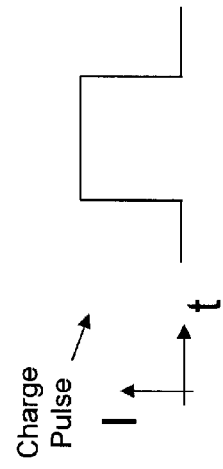
Figure 10D:
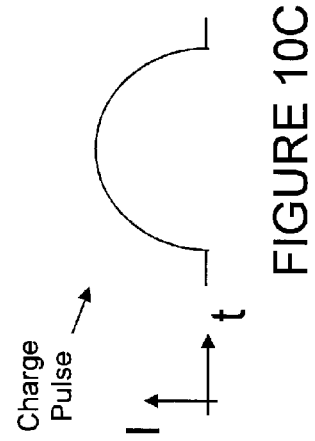
Figure 11A:
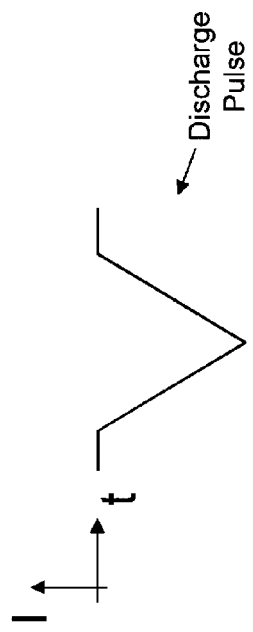
FIGS. 11A-11D illustrate exemplary discharge pulses having different shapes and pulse widths; all combinations or permutations of discharge pulse characteristics are intended to fall within the scope of the present inventions.
Figure 11B:
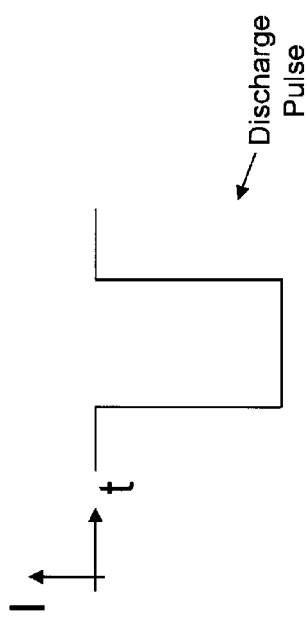
Figure 11C:
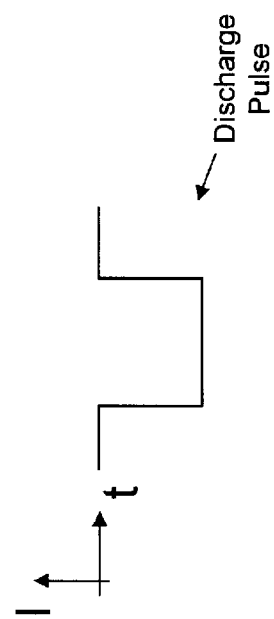
Figure 11D:
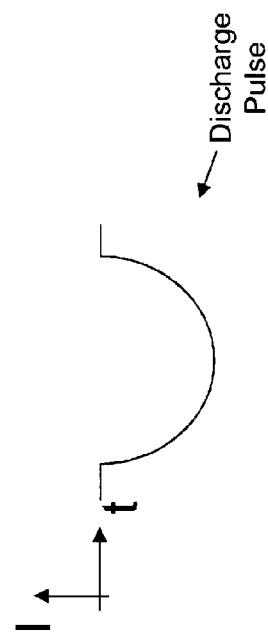

With reference to FIG. 8E, the control circuitry may implement a technique that includes N adaption loops (where N is a natural number—i.e., 1, 2, . . . ) wherein the control circuitry determines or estimates the parameters associated with each loop and/or responsively adapt the characteristics of the charging sequence based on or using the associated parameter of each loop at a corresponding rate. Notably, in each of the above embodiments, the monitoring circuitry may monitor the state, parameters and/or characteristics of the battery/cell (for example, terminal voltage) in accordance with the aforementioned rates and/or continuously, intermittently and/or periodically.

Thus, the adaptive charging techniques and circuitry of the present inventions may implement one or more adaption loops each based on one or more different parameters. The present inventions are neither limited to any combination and/or permutation of such adaptation loops. Indeed, the control circuitry may employ such adaption loops alone/separately or in any combination; all combinations or permutations thereof are intended to fall within the scope of the present inventions.

The rate at which the control circuitry implements an adaption loop may be temporally based and/or event based. For example, the control circuitry may estimate, calculate, measure and/or determine the SOC or SOH (and/or changes therein) based on one or more events and/or charging response characteristics (for example, the charge retained and/or provided battery/cell is "inconsistent" with the SOC or SOH data and/or there is an "inconsistency" between the SOC, SOH, relaxation time and/or the voltage at the terminals of the battery/cell during charging). That is, in one embodiment, in response to detecting one or more events (for example, a beginning or initiation of a charging sequence/cycle) and/or "triggerable" charging response characteristics (due to, for example, an "inconsistency" between the battery/cell charge response characteristics or parameters which suggests, for example, the SOH (which may be stored in memory) may not be as estimated or determined), the control circuitry estimates, calculates, measures and/or determines the SOH (and/or changes therein) of a battery/cell and adapts, adjusts and/or controls the amount of charge injected into the battery/cell based on or using SOH (and/or changes therein) of the battery/cell.

Further, although several of the exemplary embodiments are described and/or illustrated in the context of circuitry and/or techniques for a lithium ion technology/chemistry based battery/cell (for example, lithium-cobalt dioxide, lithium-manganese dioxide, lithium-iron phosphate, and lithium-iron disulfide), the inventions described and/or illustrated herein may also be implemented in conjunction with other electrolyte battery chemistries/technologies including, for example, nickel-cadmium and other nickel metal hydride chemistries/technologies. As such, the embodiments set forth in the context of lithium ion based batteries/cells are merely exemplary; and other electrolyte battery chemistries/technologies, implementing one or more of the features of the present inventions as described herein, are intended to fall within the scope of the present inventions. It is to be understood that other embodiments may be utilized and operational changes may be made without departing from the scope of the present inventions. Indeed, the foregoing description of the exemplary embodiments of the inventions has been presented for the purposes of illustration and description. It is intended that the scope of the inventions not be limited solely to the description herein.

Further, as discussed herein, the control circuitry may intermittently, continuously and/or periodically estimate, calculate, measure and/or determine a CPV and/or change in CPV of the battery/cell in response to a charge pulse of a charge or discharge signal and/or packet. In addition thereto, the control circuitry may intermittently, continuously and/or periodically adapt, adjust and/or control the characteristics of the charge or discharge signal, packet and/or pulse (via controlling, for example, the shape, amplitude and/or duration of the signal output of the charging circuitry) based on whether the CPV and/or a change in CPV of the battery/cell is within a predetermined range, less than a predetermined upper limit value and/or greater than a predetermined lower limit value. Thus, in one embodiment, the adaptive charging techniques and/or circuitry intermittently, continuously and/or periodically measure or monitor the CPV of the battery/cell. Based thereon or using such data, the adaptive charging techniques and/or circuitry may intermittently, continuously and/or periodically determine and/or adapt the subsequent charging and discharging of the battery/cell so that the CPV and/or change in CPV satisfies one or more of the predetermined criteria. Accordingly, adaptive charging techniques and/or circuitry of the present inventions may (i) measure or monitor the terminal voltage of the battery/cell on an intermittent, continuous and/or periodic basis, (ii) determine the CPV and/or change in CPV of the battery/cell (which is response to charge pulse(s)), (iii) determine whether a CPV and/or change in CPV is within a predetermined range and/or satisfies the predetermined limits on an intermittent, continuous and/or periodic basis, and/or (iii) adapt, adjust and/or control characteristics of the charge or current (for example, amplitude of the applied charge or current) applied to or injected into the battery/cell so that the CPV and/or change in CPV satisfies the aforementioned criteria on an intermittent, continuous and/or periodic basis. All permutations and combinations are intended to fall within the scope of the present inventions. Indeed, such embodiments are applicable to the charging techniques and/or circuitry which apply or inject (i) charge packets having one or more charge pulses and (ii) charge packets having one or more charge pulses and one or more discharge pulses.

Moreover, in one embodiment, the exemplary charge and discharge signals generated, output and/or applied by the current charging circuitry to the battery/cell may be characterized as including a plurality of packets (for example, about 1,000 to about 50,000 packets—depending on the initial SOC and the final SOC), wherein each packet includes a plurality of current pulses (for example, 1 to about 50 pulses in each packet). (See, FIGS. 3A-3K and 5A wherein the illustrative exemplary packets depict various characteristics (for example, a programmable number of pulses, pulse shapes, sequence, combination and/or spacing of charge and discharge pulses, pulse widths and/or duty cycles)). The charge pulses and discharge pulses may be any shape (for example, rectangular, triangle, sinusoidal or square). (See, for example, FIGS. 10A-10D and 11A-11D). Moreover, the current or charge pulses may include charging and discharging pulses (each having fixed, programmable and/or controllable shapes, pulse widths and/or duty cycles). (See, for example, FIGS. 3C-3G).

In addition, the packets may also include one or more rest periods having programmable or controllable durations. That is, each packet may include one or more rest periods wherein each rest period (if more than one) having a programmable and/or controllable temporal width/duration. (See, for example, FIGS. 6A and 7A).

Notably, in one exemplary embodiment, the charge and/or discharge pulses of the packet are square shaped including a temporal duration of between about 1 ms and about 100 ms, and preferably less than 30 ms. (See, for example, FIGS. 7A and 7B). This exemplary packet includes one or two charge pulses and one discharge pulse (for example, 1:1, 2:1 and/or 3:2 charge pulses to discharge pulses) wherein the amplitudes and duty cycles are programmable. (See, for example, FIGS. 7A and 7B). Further, in this exemplary embodiment, each packet includes one rest period having a programmable and/or controllable temporal width/length. In one exemplary embodiment, the intermediate rest period includes a temporal length or duration of between about 1 ms and about 20 ms. In addition, the rest period, in one exemplary embodiment, includes a temporal length or duration of between about 1 ms and about 200 ms. Notably, control circuitry 16 adapts the temporal width/length programmable rest periods (for example, the rest period ($T_{rest}$) in FIGS. 7A and 7B) based on or using data which is representative of the relaxation time of the battery/cell.

Indeed, in operation, one, some or all of the characteristics of the charge pulses and/or discharge pulses are programmable and/or controllable via charging circuitry 12 including, for example, the shape, amplitude and/or duration of the pulses. Moreover, the sequence of the charge and discharge pulses (within a packet) is programmable via charging circuitry 12. For example, the discharge pulse may temporally precede the charge pulse and/or the packet may include more charge pulses than discharge pulses (for example, 2:1 or 3:2 charge pulses to discharge pulses) or more discharge pulses than charge pulses (for example, 2:1 or 3:2 charge pulses to discharge pulses).

Moreover, the amplitude of the charge and/or discharge pulses may vary within the packet (and is/are programmable and/or controllable via the control circuitry), the duration of the charge and/or discharge pulses may vary (and is/are programmable and/or controllable via the control circuitry), and/or the duration and/or timing of the rest period(s) may vary within the packet (and is/are programmable and/or controllable via the control circuitry). Again, the control circuitry may employ such programmable characteristics so that the change in voltage at the terminals of the battery/cell in response to such pulses is within a predetermined range.

As intimated herein, the control circuitry may manage, adjust, program, and/or control the amount of charge input into the battery/cell and/or the amount of charge removed from the battery/cell via the charging circuitry. For example, the amount of charge input into the battery/cell may be controlled via adjusting, controlling and/or modifying characteristics of the charge pulses (for example, pulse amplitude, pulse width/duration and pulse shape). Similarly, the amount of charge removed from the battery/cell may be controlled via adjusting, controlling and/or modifying characteristics of the discharge pulses (for example, pulse amplitude, pulse width/duration and pulse shape).

In addition thereto, or in lieu thereof, the control circuitry may manage, adjust, program, and/or control the ratio of the amount of charge input to the battery/cell to the amount of charge removed from the battery/cell, over time, via control of the charging circuitry. In one embodiment, the control circuitry adapts, adjusts and/or controls the ratio of charge packets (which input a certain or predetermined amount of charge into the battery/cell) to discharge packets (which remove a certain or predetermined amount of charge from the battery/cell). For example, the control may provide a ratio of between five and ten charge packets to discharge packets, and in a preferred embodiment the ratio is greater than ten.

In addition thereto, or in lieu thereof, in another embodiment, the control circuitry may adjust, program, and/or control the ratio on a per packet basis (i.e., charge packet and/or discharge packet). In this regard, the control circuitry adjusts, programs, and/or controls the amount of charge input per packet and the amount of charge removed per packet to provide, manage, adjust, program, and/or control the ratio of the amount of charge input to the battery/cell to the amount of charge removed from the battery/cell, over time. Thus, in this exemplary embodiment, the control circuitry adjusts, programs, and/or controls the ratio on a packet-by-packet basis via controlling the charging circuitry.

Notably, a smaller ratio of the amount of charge input to the amount of charge removed will tend to lengthen the charge time to, for example, less than an optimal value. Under these circumstances, the charging technique is increasing cycle life via increasing charge time. However, as indicated herein, in certain aspects, the adaptive charging circuitry and techniques of the present inventions may provide, enhance, control, optimize and/or adjust the charging profile to (i) minimize and/or reduce total charging time and (ii) maximize and/or increase cycle life. As such, in certain embodiments, the adaptive charging circuitry and techniques of the present inventions may provide, enhance, control, optimize and/or adjust the charging profile to reduce the charging time without managing, increasing and/or maximizing the cycle life of the battery/cell. Similarly, in certain embodiments, the adaptive charging circuitry and techniques of the present inventions may provide, enhance, control, optimize and/or adjust the charging profile to increase the cycle life of the battery/cell without managing, reducing and/or minimizing the charging time of the battery/cell.

Thus, the characteristics of the charge pulses and/or discharge pulses are programmable, controllable and determined by the control circuitry when implementing one or more of the adaptive charging techniques described and/or illustrated herein (charging techniques to adapt, adjust and/or control one or more characteristics of the charge or current applied to or injected into the battery/cell so that the change in voltage at the terminals of the battery/cell is within a predetermined range).

The characteristics of consecutive charge and discharge packets may be repetitive. That is, the combination of charging pulses, discharging pulses and rest periods may be repetitive, which, in combination form a packet. Such packets of a charge or discharge signal may be repetitive. All combinations or permutations of charging and discharging pulses are intended to fall within the scope of the inventions.

Notably, such charge signals and discharge signals may be repeated over a charging period. The control circuitry may control, adjust, calculate and/or vary one or more of the parameters or characteristics of the charging signals and/or discharging signals via controlling one or more of the constituent packets including the charge pulses, discharging pulses and rest periods thereof. For example, the parameters or characteristics of the charging and/or discharging pulses of one or more packets of one or more charging and/or discharging signals, namely shape, durations and/or current amplitudes of the pulses, may be adaptively modified as described herein to implement the adaptive charging algorithm or techniques described herein. Indeed, in one embodiment, the duration of the charging signal may be from one millisecond to several seconds. Moreover, the duration of the discharging signal (in one embodiment) may be from one millisecond to a few hundreds of milliseconds.

There are numerous permutations involving the amount of electrical charge added to the battery/cell during the charge or charging signal and the amount of charge removed during the discharging signal. All permutations are intended to fall within the scope of the present inventions. Notably, each permutation may result in a different relaxation period. Moreover, within each permutation, there exists a large number of sub-permutations that i) combine the characteristics of the charge or charging signals (for example, the duration, shape and/or amplitude of the charging signal), the product of which determines the amount of electrical charge added to the cell; and ii) combine the characteristics of the discharging signal (for example, the duration, shape and/or amplitude of the discharging signal), the product of which determines the amount of electrical charge removed from the cell; and iii) the length of time of the rest period. The characteristics of the charge or charging signals may differ from the characteristics of the discharging signals. That is, one or more of the duration, shape and/or amplitude of the charging signal may differ from one or more of the duration, shape and/or amplitude of the discharging signal.

As stated herein, the SOC of a rechargeable battery/cell, for example, a lithium-ion battery/cell, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a 0% SOC indicates that the battery/cell is fully discharged.

Notably, in one implementation, a current source is gated by a switch (which may be implemented via one or more transistors), and the terminal voltage of the battery/cell is monitored to determine a CPV of the battery/cell. In another implementation, circuitry of the charging circuitry is employed to generate a short charge or discharge pulse. For example, a laptop computer or smartphone includes an integrated charging circuit responsible for charging the battery. As mentioned herein, the charging integrated circuit may be directly controlled through a communication bus such as, for example, I2C or SMBus®.

As indicated herein, the monitoring circuitry monitors, senses, detects and/or samples (on an intermittent, continuous and/or periodic basis) characteristics of the battery/cell including, for example, the response of the battery/cell to one or more charge pulses, the terminal voltages and the temperature. In one embodiment, the monitoring circuitry includes a sensor to determine a voltage (for example, a voltmeter) and/or a sensor to determine a current (for example, a current meter). (See, for example, FIGS. 1D and 1E). In one embodiment, the monitoring circuitry implements Kelvin-type measurement configurations in that little to no current is required to determine the voltage at the terminals of the battery/cell and the current through the battery/cell. Notably, the monitoring circuitry and techniques may be those described herein, now known or later developed, to acquire data employed by the control circuitry to adaptive the charging profile of the battery; all such monitoring circuitry and techniques are intended to fall within the scope of the present inventions.

In addition, as mentioned herein, the control circuitry acquires the data from the monitoring circuitry and, estimates, calculates and/or measures a CPV (in response to a charge pulse) and/or a change in CPV in response to a plurality of charge pulses of a plurality of packets and, if appropriate, adapts the charging process by controlling the operation of the charging circuitry. The present inventions may employ any control circuitry and charging circuitry whether that described herein, now known or later developed, to charge the battery/cell as well as adapt the charging process.

Further, as noted herein, control circuitry may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by the control circuitry using any programming language whether now known or later developed, including, for example, assembly, FORTRAN, C, C++, and BASIC, whether compiled or uncompiled code; all of which are intended to fall within the scope of the inventions.

Moreover, monitoring circuitry and control circuitry may share circuitry with each other as well as with other elements. Moreover, such circuitry may be distributed among a plurality of integrated circuits which may also perform one or more other operations, which may be separate and distinct from that described herein.

Notably, at times, terms battery and cell have been employed interchangeably to mean an electrical storage device that may be electrically charged and discharged. Such a device may include a single electrical cell, or may include several cells electrically connected in series and/or parallel to form a battery of larger electrical capacity. It shall be noted that the embodiments for adaptive charging described herein shall apply to either cells or batteries, as a single unit or multiple units electrically configured into a larger battery pack.

Notably, a "circuit" means, among other things, a single component (for example, electrical/electronic) or a multiplicity of components (whether in integrated circuit form, discrete form or otherwise), which are active and/or passive, and which are coupled together to provide or perform a desired operation. In addition, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the herein described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of the present inventions. The computer-readable media corresponding to such simulations and/or testing tools are also intended to fall within the scope of the present inventions.

In the claims, charge pulse voltage (CPV) of the battery means a peak or substantial peak voltage, measured at the terminals of the battery/cell, which is in response to a charge pulse. Further, the term "battery" means an individual cell (which stores energy) and/or a plurality of cells arranged electrically in a series and/or parallel configuration. In addition, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

What is claimed is:

1. A method to adaptively charge a battery, wherein the battery includes at least two terminals, the method comprising:
    applying a charge signal to the terminals of the battery, wherein the charge signal includes a plurality of charge packets, wherein a first charge packet includes a first charge pulse;
    measuring a plurality of terminal voltages which are in response to the first charge pulse, wherein each terminal voltage is a voltage between the terminals of the battery;
    determining a first charge pulse voltage (first CPV) of the battery, wherein the first CPV is a peak voltage which is in response to the first charge pulse;
    determining whether the first CPV of the battery is within a predetermined range or greater than a predetermined upper limit value, wherein the predetermined range and/or the predetermined upper limit value changes during charging of the battery in accordance with changes in a state of charge of the battery; and
    adapting one or more characteristics of a second charge packet of the charge signal which temporally follows the first charge packet if the first CPV of the battery is outside the predetermined range or is greater than a predetermined upper limit value.

2. The method of claim 1 wherein the predetermined range and/or the predetermined upper limit value changes in accordance with changes in a state of health of the battery.

3. The method of claim 1 wherein adapting one or more characteristics of the second charge packet includes changing the amplitude of at least a charge pulse of the second charge packet.

4. The method of claim 1 wherein adapting one or more characteristics of the second charge packet includes changing the amplitude of at least a charge pulse of the second charge packet using data which is representative of the amount of the first CPV of the battery.

5. The method of claim 1 wherein adapting one or more characteristics of the second charge packet includes changing the duration of at least a charge pulse of the second charge packet.

6. The method of claim 1 further including:
    determining whether the first CPV of the battery is less than a predetermined lower limit value; and
    adapting one or more characteristics of the second charge packet if the first CPV of the battery is less than a predetermined upper limit value.

7. The method of claim 1 wherein the second charge packet and the first charge packet are temporally successive charge packets.

8. The method of claim 1 further including:
    determining a second charge pulse voltage (second CPV) of the battery, wherein the second CPV is a peak voltage which is in response to a second charge pulse of the charge signal;
    determining whether the second CPV of the battery is within a predetermined range or greater than a predetermined upper limit value; and
    adapting one or more characteristics of a third charge packet of the charge signal which temporally follows the second charge packet if the second CPV of the battery is outside the predetermined range or is greater than a predetermined upper limit value, wherein:

the predetermined range and/or the predetermined upper limit value changes during charging of the battery in accordance with changes in a second state of charge of the battery.

9. A method to adaptively charge a battery, wherein the battery includes at least two terminals, the method comprising:
applying a charge signal to the terminals of the battery, wherein the charge signal includes a plurality of charge pulses including a first charge pulse and a second charge pulse;
measuring a plurality of terminal voltages which are in response to the first and second charge pulses, wherein each terminal voltage is a voltage between the terminals of the battery;
determining a first charge pulse voltage (first CPV) of the battery, wherein the first CPV is a peak voltage which is in response to the first charge pulse;
determining a second charge pulse voltage (second CPV) of the battery, wherein the second CPV is a peak voltage which is in response to the second charge pulse;
determining a change between the first CPV and the second CPV; and
adapting one or more characteristics of a third charge pulse if the change between the first CPV and the second CPV is outside a predetermined range or is greater than a predetermined upper limit value, wherein the third charge pulse temporally follows the first and second charge pulses.

10. The method of claim 9 wherein the predetermined range and/or the predetermined upper limit value changes during charging of the battery in accordance with changes in a state of charge of the battery or changes in accordance with changes in a state of health of the battery.

11. The method of claim 9 wherein adapting one or more characteristics of the third charge pulse includes changing the amplitude of the third charge pulse.

12. The method of claim 9 wherein adapting one or more characteristics of the third charge pulse includes changing the duration of the third charge pulse.

13. The method of claim 9 wherein the first and second charge pulses are temporally sequential.

14. The method of claim 9 wherein the first and second charge pulses are temporally non-sequential.

15. An apparatus to adaptively charge a battery, wherein the battery includes at least two terminals, the apparatus comprising:
charging circuitry, responsive to control signals, to generate a charge signal which is applied to the terminals of the battery, including a first charge pulse and a second charge pulse, wherein the first charge pulse temporally precedes the second charge pulse;
measurement circuitry, coupled to the battery, to measure a plurality of voltages which are in response to the first charge pulse at the terminals of the battery; and
control circuitry, coupled to the charging circuitry and the measuring circuitry, the control circuitry is configured to:
determine a first charge pulse voltage (first CPV) of the battery, wherein the first CPV is a peak voltage which is responsive to the first charge pulse;
determine whether the first CPV of the battery is within a first predetermined range or greater than a first predetermined upper limit value;
generate the one or more control signals to adapt one or more characteristics of the charge signal if the first CPV is outside the first predetermined range or is greater than the first predetermined upper limit value;
determine a second charge pulse voltage (second CPV) of the battery, wherein the second CPV is a peak voltage which is in response to a second charge pulse;
determine whether the second CPV of the battery is within a second predetermined range or greater than a second predetermined upper limit value; and
generate one or more additional control signals to adapt one or more characteristics of the charge signal if the second CPV is outside the second predetermined range or is greater than the second predetermined upper limit value, wherein the first predetermined range and the first predetermined upper limit value correspond to a first state of charge (SOC) of the battery and the second predetermined range and the second predetermined upper limit value correspond to a second SOC of the battery.

16. The apparatus of claim 15 wherein the control circuitry includes peak voltage detector circuitry to determine the first CPV.

17. The apparatus of claim 15 wherein the first predetermined range and the first predetermined upper limit value change during charging of the battery in accordance with changes in a state of charge of the battery and wherein the first predetermined range and the first predetermined upper limit value correspond to a first SOC of the battery.

18. The apparatus of claim 15 wherein, in response to the control signals, the charging circuitry changes the amplitude of at least a charge pulse of the charge signal.

19. The apparatus of claim 15 wherein the control circuitry is further configured to:
determine whether the first CPV of the battery is less than a predetermined lower limit value; and
generate the one or more control signals to adapt one or more characteristics of a charge pulse of the charge signal if the first CPV is less than a predetermined upper limit value.

20. An apparatus to adaptively charge a battery, wherein the battery includes at least two terminals, the apparatus comprising:
charging circuitry, responsive to control signals, to generate a charge signal which is applied to the terminals of the battery to charge the battery, wherein the charge signal includes a plurality of charge pulses including a first charge pulse and a second charge pulse, wherein the first charge pulse temporally follows the second charge pulse;
measurement circuitry, coupled to the battery, to measure a plurality of voltages at the terminals of the battery, including voltages which are in response to the first and second charge pulses; and
control circuitry, coupled to the charging circuitry and the measuring circuitry, the control circuitry is configured to:
determine a first charge pulse voltage (first CPV) of the battery, wherein the first CPV is a peak voltage which is responsive to the first charge pulse;
determine a second charge pulse voltage (second CPV) of the battery, wherein the second CPV is a peak voltage which is responsive to the second charge pulse;
determine a change between the first CPV and the second CPV; and
generate the one or more control signals to adapt one or more characteristics of a third charge pulse if the change between the first CPV and the second CPV is outside a predetermined range or is greater than a predetermined upper limit value, wherein the third charge pulse temporally follows the first and second charge pulses.

21. The apparatus of claim 20 wherein the predetermined range and/or the predetermined upper limit value changes during charging of the battery in accordance with changes in a state of charge of the battery.

22. The apparatus of claim 20 wherein the predetermined range and/or the predetermined upper limit value changes in accordance with changes in a state of health of the battery.

23. The apparatus of claim 20 wherein the one or more control signals adapt the amplitude and/or the duration of the third charge pulse.

24. The apparatus of claim 20 wherein the first and second charge pulses are temporally sequential.

25. The apparatus of claim 20 wherein the first and second charge pulses are temporally non-sequential.

* * * * *